United States Patent
Agarwal et al.

(10) Patent No.: US 12,300,304 B2
(45) Date of Patent: May 13, 2025

(54) DETECTING AND MITIGATING MEMORY ATTACKS

(71) Applicant: Microsoft Technology Licensing, LLC, Redmond, WA (US)

(72) Inventors: Ishwar Agarwal, Redmond, WA (US); Stefan Saroiu, Redmond, WA (US); Alastair Wolman, Seattle, WA (US); Daniel Sebastian Berger, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 289 days.

(21) Appl. No.: 17/959,123

(22) Filed: Oct. 3, 2022

(65) Prior Publication Data
US 2024/0112723 A1    Apr. 4, 2024

(51) Int. Cl.
*G11C 11/4078*   (2006.01)
*G11C 11/406*    (2006.01)

(52) U.S. Cl.
CPC .... *G11C 11/4078* (2013.01); *G11C 11/40615* (2013.01); *G11C 11/40618* (2013.01)

(58) Field of Classification Search
CPC .......... G11C 11/4078; G11C 11/40615; G11C 11/40618
USPC ........................................................ 365/222
See application file for complete search history.

(56) References Cited

U.S. PATENT DOCUMENTS

| 2014/0281206 A1 | 9/2014 | Crawford et al. |
| 2019/0066808 A1 | 2/2019 | Nale |
| 2024/0079042 A1* | 3/2024 | Ahn .................. G11C 11/40611 |

OTHER PUBLICATIONS

International Search Report and Written Opinion received for PCT Application No. PCT/US2023/031321, Dec. 18, 2023, 11 pages.

* cited by examiner

*Primary Examiner* — Huan Hoang
*Assistant Examiner* — Daniel J King
(74) *Attorney, Agent, or Firm* — Ray Quinney & Nebeker; James Bullough

(57) ABSTRACT

The present disclosure relates to systems and methods implemented on a memory controller for detecting and mitigating memory attacks (e.g., row hammer attacks). For example, a memory controller may engage a counting mode in which activation counts for memory sub-banks are tracked. For example, a memory controller may engage a counting mode in which activation counts for memory rows of memory sub-banks are maintained. Under certain conditions, the memory controller may transition from the counting mode to a sampling mode to mitigate potential row hammer attacks. The memory controller may consider various conditions in determining whether to continue detecting and mitigating potential row hammer attacks in the sampling mode and/or transitioning back to the counting mode. By selectively transitioning between the different operating modes, the memory controller may reduce periods of time when the memory hardware is vulnerable to attacks.

21 Claims, 10 Drawing Sheets

DETECTING AND MITIGATING MEMORY ATTACKS

BACKGROUND

Recent years have seen a rise in the use of computing devices (e.g., mobile devices, personal computers, server devices, cloud computing systems) to receive, store, edit, transmit, process, or otherwise utilize digital data for various processing applications and services. Indeed, it is now common for individuals and businesses to employ the use of computing resources on cloud computing architectures and on a variety of computing devices. As demand for memory resources grows, memory resources continue to expand in availability and complexity across a variety of computing platforms.

In some memory systems, a number of security exploits have been used to take advantage of unintended and/or undesirable side effects in dynamic random access memory (DRAM) hardware. As an example, some malicious actors have found ways to corrupt data in memory cells by using row hammer attacks. These attacks typically involve rapidly activating one or more memory rows numerous times in quick succession to cause charges from nearby memory cells to leak and ultimately corrupt the data thereon. Moreover, as DRAM fabrication processes continues to shrink, row hammer attacks have the potential to impact a higher number of memory cells.

Detecting and mitigating row hammer attacks poses a significant challenge for memory systems. For example, conventional approaches often involve expending significant processing resources (e.g., memory hardware) to accurately identify specific aggressor rows (i.e., rows with high rates of activations) or victim rows (i.e., rows under attack). Alternatively, where conventional systems do not dedicate significant hardware resources to identifying and stopping row hammer attacks, these systems can easily become overwhelmed, particularly where hardware is operating outside of normal operating conditions or where the hardware is being accessed in a non-conventional manner.

These and other problems exist in connection with detecting and mitigating memory attacks, and particularly with regard to detecting and mitigating row hammer attacks.

DETAILED DESCRIPTION

Figure 1:
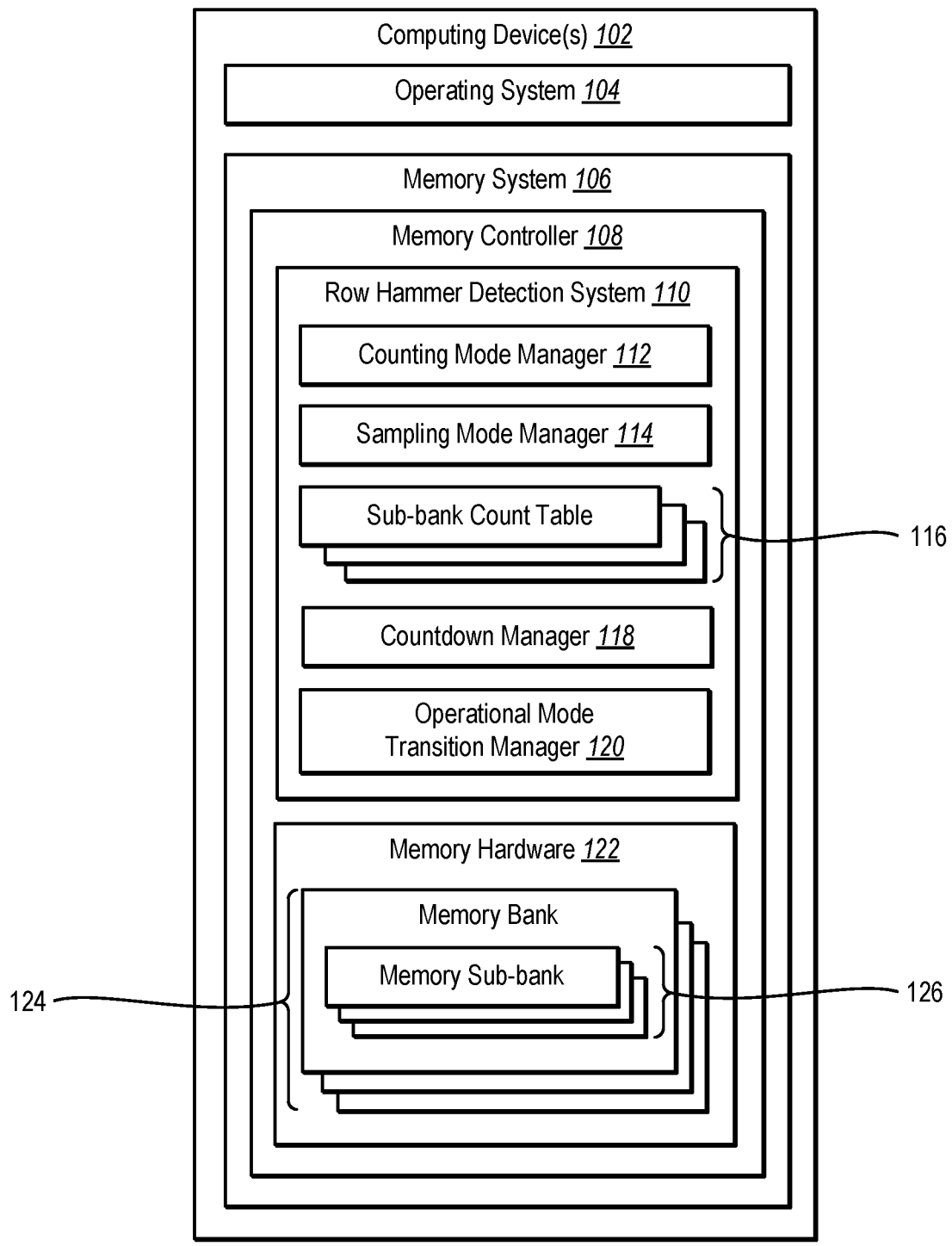
FIG. 1 illustrates an example computing device environment including a memory system having a memory controller that includes a row hammer detection system implemented thereon.

The present disclosure is generally related to detecting and mitigating memory attacks (e.g., row hammer attacks) on a memory system. In particular, one or more embodiments described herein relate to a hybrid approach to detecting potential aggressor rows (e.g., row addresses) within a memory hardware (e.g., dynamic random access memory (DRAM)) using multiple operational modes. For example, as will be discussed in further detail below, a memory controller may engage a counting mode in which activation counts for memory rows of memory sub-banks are maintained. Under certain conditions, the memory controller may transition from the counting mode to a sampling mode to mitigate potential row hammer attacks. Moreover, one or more embodiments described herein involve determining whether to continue detecting and mitigating potential row hammer attacks in the sampling mode and/or transitioning back to the counting mode.

As an illustrative example, a row hammer detection system may engage a counting mode for a memory sub-bank by maintaining counts of row activations for memory rows within the memory sub-bank as well as a spillover count based on memory row activations not included within a plurality of counts. Based on determining that the spillover count exceeds a threshold, the row hammer detection system may engage a sampling mode for the memory sub-bank. While in the sampling mode, the row hammer detection system may determine whether to report a row address as an aggressor row based on a comparison of a random number and a sampling threshold as well as maintaining a countdown for the sampling mode that determines a duration of time that a memory controller remains in the sampling mode. Additional details in connection with the counting and sampling modes will be discussed in further detail below.

After the countdown has iterated (e.g., increased or decreased) to a threshold value, the row hammer detection system may re-engage the counting mode. In one or more embodiments, the row hammer detection system may determine whether to engage (e.g., re-engage) the counting mode based on the countdown value and one or more additional factors. For example, while engaged in the sampling mode, the row hammer detection system may continue maintaining activation counts of rows of a memory sub-bank and consider a number of times that the spillover count has exceeded a threshold value over some duration of time before determining whether to re-engage the counting mode.

The present disclosure includes a number of practical applications that provide benefits and/or solve problems associated with detecting and mitigating row hammer attacks taking place on memory sub-banks of a memory hardware. Examples of some of these applications and benefits are discussed below.

For example, by transitioning between an activation counting mode (or simply a "counting mode") and a sampling mode, the row hammer detection system can provide a low computational cost alternative to maintaining an expensive and robust record of activations for a memory bank or plurality of memory banks. Indeed, where conventional methods typically involve maintaining a large record of activation instances for one or more entire memory banks to ensure that a specific instance of a row hammer attack is detected, the row hammer detection system transitions between a counting mode and a sampling mode using a hybrid scheme to predict that a row hammer attack is potentially happening and allows the row hammer detection system to identify a location of the attack within an acceptable amount of time.

In addition, rather than tracking activation counts for an entire memory system or for entire memory banks, this hybrid approach enables the row hammer detection system to track activations on a sub-bank level while effectively detecting and mitigating row hammer attacks. This smaller scale tracking methodology allows the row hammer detection system to maintain activation counts using smaller count tables that are maintained for corresponding memory sub-banks. Tracking and detecting row hammer attacks at a sub-bank level allows the row hammer detection system to activate a sampling mode for an associated sub-bank that becomes overwhelmed while allowing other sub-banks to be monitored using the counting mode. Further, features of the systems described herein reduce the associativity of the table from potentially thousands down to a much smaller amount (e.g., 16, 32) while reducing a total number of counters (e.g., by a factor of 20 or 30). This reduced associativity additionally enables the systems described herein to meet the performance needs of a memory controller, which would be difficult or impossible with conventional approaches.

As noted above, and as will be discussed in further detail below, one or more embodiments described herein involve implementation of a hybrid scheme in which a memory controller transitions between a counting mode and a sampling mode in detecting a potential row hammer attack. This hybrid approach enables a memory controller to maintain activation count tables without consuming or otherwise occupying a massive quantity of memory resources that conventional approaches would otherwise require. For example, where a conventional approach that relies exclusively on a heavy-hitting counting mode would require 10s of Megabytes (MBs) of static random access memory (SRAM) to reliably detect instances of row hammer attacks, the approaches described herein involve a much smaller scale of SRAM resources to track activation counts across multiple memory sub-banks. Indeed, features of the row hammer detection system with regard to implementing a hybrid detection scheme on a sub-bank level can reduce the quantity of SRAM needed to detect and mitigate row hammer attacks for similarly sized memory banks by a scale of $1/100^{th}$ or $1/1000^{th}$ over conventional approaches. Indeed, as mentioned above, implementing the hybrid scheme described herein can reduce the number of counters by a factor of 20, 30, or more over conventional approaches.

Furthermore, features of the row hammer detection system reduce computational and hardware expenses on a memory controller while still maintaining a very low probability that a row hammer attack will go unchecked. For example, by identifying a specific memory sub-bank that may be affected by a row hammer attack and then selectively activating a sampling mode for the memory sub-bank, the row hammer detection system can implement a sampling mode on a sub-bank level without interrupting operation on the other sub-banks of the memory hardware. This allows the row hammer detection system to implement the sampling mode on a smaller portion of the memory hardware using a sampling threshold that nearly guarantees a row hammer attack will be found and prevented before causing data corruption on nearby memory cells.

In one or more embodiments, the row hammer detection system includes features and capabilities that allow for detection and mitigation of row hammer attacks without requiring that the memory hardware share or make available all hardware and topology information to a memory controller. For example, by identifying a specific row (and/or blast radius) of memory that is predicted to be an aggressor row in a row hammer attack, the row hammer detection system can issue a command to the memory hardware that allows the memory hardware to locally take steps and mitigate the identified row hammer attack. As noted above, this command may be issued without requiring that the hardware share certain information with the memory controller that certain hardware vendors prefer to avoid sharing. This allows the row hammer detection system to be implemented on memory controllers across a variety of hardware architectures to detect and mitigate a variety of memory attacks across different computing devices.

In addition to the benefits above, the row hammer detection system may implement an effective approach in switching between the respective operational modes. For example, while the sampling mode provides an effective approach to detecting and mitigating a potential or ongoing row hammer attack, engaging the sampling mode indefinitely may be an undesirable approach when a row hammer attack is not currently ongoing or where a row hammer attack has been effectively mitigated. As will be discussed in further detail below, the row hammer detection system utilizes a variety of features to selectively determine whether to re-engage a counting mode after previously transitioning from the counting mode to a sampling mode. For example, the row hammer detection system may implement a countdown measure or track a number of activation counts over a series of refresh windows to determine a number of times when a countdown mode would have become overwhelmed while the memory controller has engaged the sampling mode.

Indeed, by selectively managing how often the row hammer detection system causes a memory controller from transitioning between operational modes, the row hammer detection system may limit the amount of time (e.g., a number of refresh windows) that the memory hardware is vulnerable to row hammer attacks. In particular, because the act of transitioning between operational modes (e.g., from a counting mode to a sampling mode) may leave a memory hardware vulnerable for a brief period of time (e.g., one refresh window), the row hammer detection system may benefit from reducing a number of refresh windows the memory hardware is transitioning between operational modes. By implementing a countdown, the row hammer detection system may control the number of refresh windows over which the memory hardware is vulnerable, thus reducing the probability that a memory attack, such as a row hammer attack, will successfully corrupt data on the memory hardware.

The row hammer detection system may additionally incorporate features and functionality to prevent a deterministic approach to attacking memory hardware. For example, as will be discussed in further detail below, the row hammer detection system may implement a measure of randomness in setting or otherwise initializing a countdown or duration over which the row hammer detection system engages a sampling mode. For example, where the row hammer detection system implements a countdown that determines a length of time that the memory controller implements a sampling mode, the row hammer detection system may initialize the countdown with some randomness to prevent a sophisticated attack from anticipating the countdown length and configuring a row hammer attack accordingly.

As illustrated in the foregoing discussion, the present disclosure utilizes a variety of terms to described features and advantages of the systems herein. Additional detail is now provided regarding the meaning of some example terms.

For example, a "computing device" may refer to a computing node, a server node, a host device, or any electronic device having memory hardware thereon (or accessible thereto). In one or more embodiments described herein a computing device may refer to a server device on a network of connected network devices (e.g., a cloud computing system). Alternatively, a computing device may refer to a mobile or non-mobile device, such as a laptop, desktop, phone, tablet, or other device capable of accessing memory resources of one or more memory devices. In one or more embodiments descried herein, the computing devices refers to the device or system on which memory hardware and associated memory controller(s) are implemented. Additional detail in connection with some general features and functionalities of a computing device will be discussed below in connection with FIG. 10.

As used herein, "memory hardware" or "memory resource(s)" may refer to accessible memory across one or more computing devices. For example, memory hardware may refer to a local memory store having blocks of memory that are accessible to applications or an operating system on a computing device. The memory hardware may refer to memory that is managed by one or more integrated memory controllers (or simply "memory controllers") that are co-located on a memory system or otherwise implemented on a computing device. A memory device may refer to any memory resource managed by a memory controller including local, external, remote, or pooled memory that is accessible to one or multiple computing devices. Indeed, a memory hardware may refer to any memory device managed by the memory controller.

A memory hardware may refer to a memory resource of a variety of memory types. In one or more embodiments described herein, a memory device may refer to dynamic access memory (DRAM), static random access memory (SRAM), flash memory, or other non-persistent memory source. A memory system may include dual in-line memory module (DIN) devices (or other device-types) that provide an accessible memory source. In one or more embodiments, a memory device may include multiple memory banks that provide portions of memory resources to various applications or processes.

As used herein, a "memory bank" may refer to a unit of memory on a memory hardware. For example, a memory bank may refer to a logical partition of memory that is divided across multiple chips on a memory system. In one or more specific examples described herein, a memory bank refers to one of a plurality of similarly sized memory banks that represent a corresponding portion of the memory hardware. As an illustrative example consistent with one or more embodiments described herein, a memory hardware may include sixty-four (64) memory banks with each memory bank including eight (8) sub-banks. As used herein, a memory sub-bank may refer to a portion (e.g., a subset) of memory resources from a corresponding memory bank. It will be appreciated that while one or more embodiments are described herein in connection with memory hardware having a specific number (e.g., 64) memory banks that each include eight memory sub-banks, other implementations may include any number of memory banks where one or more of the memory banks include a variable number of multiple memory sub-banks. It will also be appreciated that the memory banks and corresponding sub-banks may refer to a variety of different sized memory resources.

As will be discussed in connection with examples below, a memory controller may track a count of activations (e.g., row activations) across a plurality of memory sub-banks. In one or more embodiments, the memory controller may perform this tracking of activation counts while operating in a counting mode. As used herein, an "activation" or "row activation" may refer to an instance where a memory cell(s) (e.g., a row address) is activated and becomes readable or otherwise accessible for a period of time (e.g., a refresh interval). A row address may be activated without necessarily being read or accessed. In one or more embodiments, a memory system may have different policies governing how many times a row can be accessed during a period of activation. In one or more embodiments, a row may be accessed only a single time per activation. Other implementations may involve multiple accesses during a single activation.

As used herein, a "counting mode" refers to an operational mode of the memory controller with respect to a corresponding memory sub-bank in which the memory controller tracks counts of row activations of the memory sub-bank. For example, as will be discussed below, the row hammer detection system can maintain an activation count table that includes a plurality of counts for corresponding memory addresses (e.g., memory row addresses). The activation count table may additionally include a spillover count.

In one or more embodiments described herein, the counting mode refers specifically to a row activation counting mechanism that involves maintaining estimations of activations for rows while maintaining a spillover count value and determining whether the counting mode is overwhelmed based on the spillover count value. Other implementations may involve other counting mechanisms that include other means for determining whether the counting mode has become overwhelmed. For instance, a counting bloom filter or variation thereof may be used in which an array of counters is maintained and row addresses are hashed x-number of times, counts are looked-up at different increments, and the count is compared against a threshold to determine whether the counting mode is being overwhelmed. Indeed, any of a variety of variants of data structures can be used for determining whether a counting mode is overwhelmed and whether a sampling mode should be engaged.

In one or more embodiments, the row hammer detection system may cause the memory controller to transition to or otherwise activate a sampling mode. As used herein, a "sampling mode" refers to an operational mode of the memory controller with respect to a corresponding memory sub-bank in which the memory controller generates a random number for activated rows and compares the random number to a sampling threshold. Based on the comparison, the memory controller can report the address/row by generating and issuing a refresh command indicating the memory address as a predicted aggressor row of a row hammer attack. After resolving the row hammer attack, the memory controller may return to the sampling mode for the corresponding memory sub-bank.

In one or more embodiments described herein, different periods of time are used in reference to features of the row hammer detection system, such as an activation period (e.g., a duration of time associated with a row activation) or a duration of time over which activations are tracked or a number of intervals over which a countdown is measured. As an example, a "refresh window" may refer to a duration of time including a plurality of "refresh intervals." While the specific length of a refresh window and refresh interval may vary between different examples, the duration of a refresh window and a refresh interval may be determined from hardware specifications (e.g., DRAM specifications). To illustrate, in one or more implementations described herein, a refresh window is approximately thirty-two (32) milliseconds, with each refresh window including a predetermined number (e.g., eight thousand ninety-two (8092)) of refresh intervals having a predetermined length (e.g., 3.9 microseconds).

Additional detail will now be provided regarding example features and functionality of a row hammer detection system in relation to illustrative figures portraying example implementations. In particular, FIG. 1 illustrates an example implementation of a computing device(s) 102 having an operating system 104 thereon. The computing device(s) 102 may refer to any of a variety of computing devices discussed above. Further, the operating system 104 may refer to a system for managing software and hardware on the computing device 102. In addition to features of conventional operating systems, one or more embodiments of the operating system 104 can facilitate transitioning between the memory controller operating in a counting mode or a sampling mode, which (as will be discussed below) may be based on data maintained on a memory controller. Further detail in connection with causing the memory controller to transition between operational modes will be discussed below.

As further shown in FIG. 1, the computing device(s) 102 includes a memory system 106. The memory system includes a memory controller 108 and memory hardware 122. In addition to the features that will be discussed in connection with detecting and mitigating row hammer attacks, the memory controller 108 may generally control flow of data to and from the memory hardware 122. For example, the memory controller 108 may manage read and write operations to the memory hardware 122. The memory controller 108 may also track and manage data associated with reading and writing to the memory hardware 122. The memory controller 108 may further implement error detection and correction features with respect to the memory resources on the memory hardware 122.

As noted above, and as will be discussed in further detail below, the memory controller 108 may provide features related to detecting and mitigating row hammer attacks on the memory hardware 122. For example, as shown in FIG. 1, the memory controller 108 includes a row hammer detection system 110. As will be discussed in further detail below, the row hammer detection system 110 may implement features and functionality related to detecting and mitigating row hammer attacks. As noted above, the row hammer detection system 110 may implement a variety of operational modes in detecting and mitigating row hammer attacks.

As shown in FIG. 1, the row hammer detection system 110 may include a counting mode manager 112. The counting mode manager 112 may implement a counting mode in which counts for addresses (e.g., row addresses) are maintained within activation count tables for a plurality of memory sub-banks on the memory hardware 122. In particular, the counting mode manager 112 may determine estimated counts for a plurality of row addresses of corresponding memory sub-banks and determine, based on the estimated activation counts and a corresponding spillover account, whether a particular sub-bank is being overwhelmed by a potential row hammer attack. Additional detail in connection with the counting mode will be discussed in detail below.

As further shown in FIG. 1, the row hammer detection system 110 may include a sampling mode manager 114. The sampling mode manager 114 may implement a sampling mode for one or more memory sub-banks that become overwhelmed when maintaining activation counts within corresponding activation count tables. In particular, upon detecting a potential row hammer attack on an address (e.g., a row address) for an associated memory sub-bank, the sampling mode manager 114 may apply a sampling mode in which a random number is generated for each memory row activation and compared against a sampling threshold. Based on the comparison, the sampling mode manager 114 may estimate that a row hammer attack is occurring on the associated memory address and generate a refresh command to send to the memory hardware 122. Additional detail in connection with the sampling mode will be discussed in detail below.

As shown in FIG. 1, the row hammer detection system 110 may include a plurality of sub-bank count tables 116. The sub-bank count tables 116 may include records of memory addresses (e.g., row addresses) and corresponding row activation counts for an associated period of time (e.g., a refresh window). The sub-bank count tables 116 may additionally include spillover counts for each of the corresponding sub-banks. As will be discussed in further detail below, the row hammer detection system 110 (e.g., the counting mode manager 112) may consider the counts of the corresponding row addresses in combination with a spillover count to determine whether an address from a particular sub-bank has an aggressor memory address (e.g., an aggressor row) that is part of a row hammer attack.

As shown in FIG. 1, the row hammer detection system 110 may include a countdown manager 118. The countdown manager 118 may maintain a countdown that iterates a countdown value (e.g., increments or decrements a countdown value) at periodic intervals to indicate a period of time that the row hammer detection system 110 has engaged a particular operational mode. In particular, while engaged in a sampling mode, the row hammer detection system 110 may maintain a countdown for the sampling mode (e.g., a countdown indicating a duration that the row hammer detection system 110 has engaged the sampling mode) by iterating a value of the countdown at periodic intervals (e.g., every refresh window). As will be discussed below, this countdown provides a mechanism whereby the row hammer detection system 110 may facilitate re-engaging the counting mode after a period of time. Moreover, this countdown provides a mechanism that reduces a number of refresh intervals over which the memory hardware 122 is vulnerable to row hammer attacks.

As shown in FIG. 1, the row hammer detection system 110 additionally includes an operational mode transition manager 120. The operational mode transition manager 120 may determine or provide information that enables the operating system 104 to determine when to transition between the respective operational modes. For example, the operational mode transition manager 120 may include conditions or instructions that indicate when the row hammer detection system 110 should disengage the counting mode and transition to the sampling mode. Conversely, the operational mode transition manager 120 may include conditions or instructions that indicate when the row hammer detection system 110 should re-engage the counting mode after operating in the sampling mode for some duration of time. Additional information in connection with transitioning between the operational modes will be discussed below.

As mentioned above, the memory system 106 includes a memory hardware 122 that provides memory resources to any of a variety of applications managed by the operating system 104. As noted above, the memory controller 108 may provide access to and control the flow of data between the operating system 104 and the memory hardware 122. As shown in FIG. 1, the memory hardware 122 may include a plurality of memory banks 124 with each memory bank including a plurality of memory sub-banks 126.

While one or more embodiments described herein refer to implementations of the memory hardware 122 including a specific number of memory banks 124 and corresponding sub-banks 126, it will be appreciated that the memory hardware 122 may include any number of memory banks and associated sub-banks. As noted above, a memory bank may refer to a logical partition of a memory resource from the memory hardware 122 with a memory sub-bank referencing a subset of the memory resource of a corresponding memory bank. In one or more embodiments described herein, the memory hardware 122 includes sixty-four memory banks with each memory bank having an associated set of eight memory sub-banks. These memory banks and associated sub-banks may represent similar sized resources or, alternatively, may differ in size within the memory hardware 122. In one or more embodiments, the memory banks may refer to physically contiguous rows of memory cells. Alternatively, the memory banks 124 and corresponding memory sub-banks 126 may include rows that are spaced out across the memory hardware 122.

While FIG. 1 illustrates an example implementation of a computing device 102 in accordance with one or more embodiments, it will be understood that other implementations described herein may be implemented on a different environment of computing device(s). For instance, in one or more embodiments, the computing device(s) 102 may include multiple memory systems implemented on different memory devices (e.g., a pooled memory system) being accessible to one or more applications or virtual machines hosted by the computing device(s). In one or more embodiments, the environment may include multiple computing devices having access to memory resources on a single memory system. In each implementation, the memory hardware 122 may be managed by a corresponding memory controller 108 having a row hammer detection system 110 implemented thereon.

Figure 2:
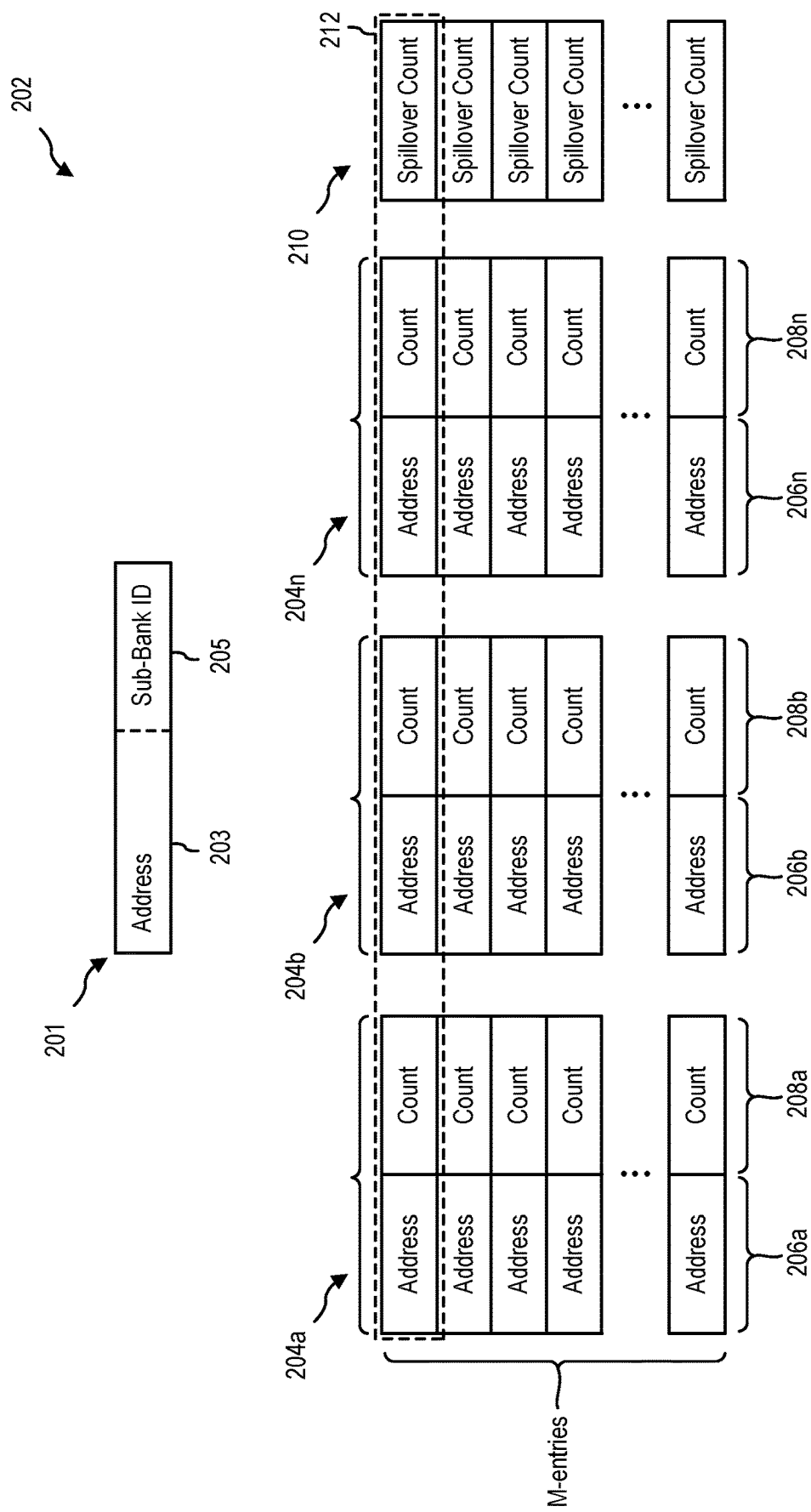
FIG. 2 illustrates an example implementation of an activation count record showing a record of activation counts and spillover counts for row addresses across a plurality of memory sub-banks.

As noted above, the row hammer detection system 110 (e.g., the counting mode manager 112) may implement a counting mode to track activation counts for corresponding sub-banks 126 from the plurality of memory banks 124 on the memory hardware 122. FIG. 2 illustrates an example implementation showing an activation count record 202 within which activation counts are maintained for row addresses on the memory hardware 122.

As shown in FIG. 2, the activation count record 202 includes a record of entries including row addresses and corresponding activation counts. For example, the activation count record 202 includes a plurality of entry columns 204a-n including M-number of rows. As will be discussed in further detail below, each row of the different columns is associated with a corresponding memory sub-bank. Further, each entry column of the plurality of entry columns 204a-n correspond to a parallel way of a memory structure within the memory controller 108.

For example, in one or more embodiments, a number of entry columns 204a-n are based on a number of parallel ways that enables read access to all address values (e.g., all 16 address values) in parallel. In one or more embodiments described herein, the activation count record 202 is maintained within a static random access memory (SRAM) structure having sixteen parallel points of access (e.g., sixteen parallel ways). In one or more embodiments, the size of the activation count tables are determined based on the parallel capabilities of the SRAM structure. Thus, while one or more embodiments describe rows having sixteen entries representative of estimated activation counts for corresponding memory sub-banks, other implementations may have fewer or additional entries based on the SRAM structure having additional parallel ways.

As shown in FIG. 2, the plurality of entry columns 204a-n include columns of memory addresses 206a-n and corresponding activation counts 208a-n. For example, a first entry column 204a may include a first set of addresses 206a and a corresponding first set of activation counts 208a. The first set of addresses 206a may include row addresses from different sub-banks and associated activation counts 208b indicated estimated activation counts for the corresponding row addresses. Similarly, a second access column 204b may include a second set of addresses 206b and a corresponding second set of activation counts 208b. The access columns 204a-n may include any number of addresses and corresponding activation counts up to an Nth set of addresses 206n and a corresponding Nth set of activation counts 208n.

In addition to the addresses 206a-n and the corresponding activation counts 208a-n, the activation count record 202 may include a spillover column 210 indicating a spillover count for each of the rows of the activation count record 202 corresponding to respective memory sub-banks. For example, a first row of the activation count record 202 may include a first spillover count, a second row of the activation count record 202 may include a second spillover count, and so on. As noted above, where a memory hardware 122 includes sixty-four memory banks that each include eight memory sub-banks, the activation count record 202 may include five-hundred twelve rows that are each representative of a corresponding memory sub-bank. It will also be noted that each entry of a corresponding sub-bank is associated with a different entry column 204a-n accessible via a different parallel way of the memory controller hardware. This parallelism allows for fast access and update of the respective entries within the activation count record 202.

FIG. 2 additionally illustrates an example row activation command 201 in accordance with one or more embodiments. In the illustrated example, the row activation command 201 includes a row address 203 and a sub-bank identifier 205. When a row is accessed, the row activation command 201 is sent by the memory controller 108. In the illustrated example, the sub-bank identifier 205 corresponds to the three least significant bits of the row activation command 201, which are used to identify a corresponding sub-bank. As noted above, each row of the activation count record 202 corresponds to a sub-bank. Accordingly, the three least significant bits may be used to identify a specific row of the activation count record 202. The row address 203 may then be evaluated and considered in updating one or more entries within a corresponding row of the activation count record 202. Additional information in connection with which entry to update or, alternatively, to iterate the spillover count, will be discussed below in connection with an example activation count table for a corresponding sub-bank illustrated in FIG. 3.

As noted above, and as illustrated in FIG. 2, each row of the activation count record 202 refers to an activation count table for an associated memory sub-bank. In addition, as discussed above, upon receiving a row activation command 201, the row hammer detection system 110 may update a corresponding row of the activation count record 202 (e.g., based on the sub-bank identifier 205 included within the row activation command 201). To further illustrate the process for updating a row from the activation count record 202, additional information will be discussed in connection with an example row 212 of the activation count record 202 corresponding to a first sub-bank represented within the activation count record 202. By way of example, the example row 212 of entries is further illustrated in an example activation count table shown in FIG. 3.

Figure 3:
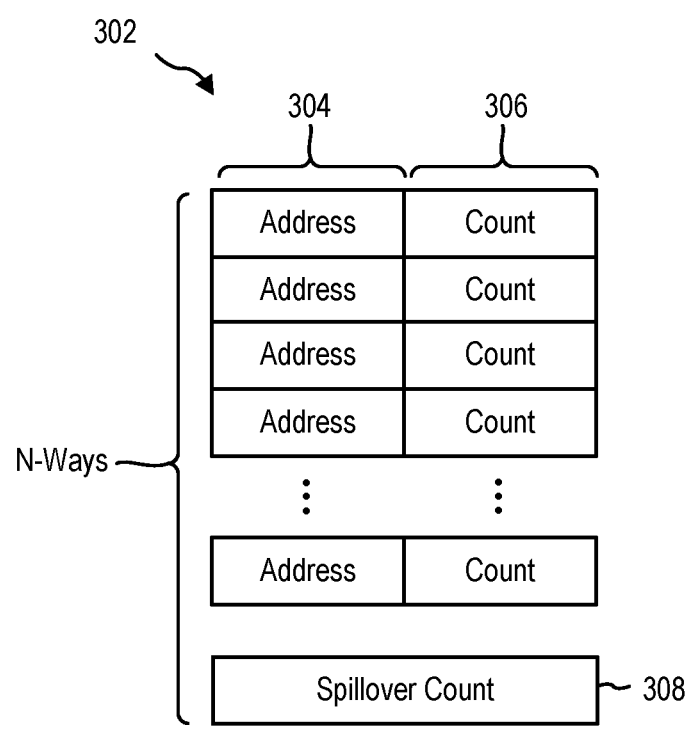
FIG. 3 illustrates an example activation count table for a memory sub-bank in accordance with one or more embodiments.

FIG. 3 illustrates an example activation count table 302 in accordance with one or more embodiments described herein. As noted above, the activation count table 302 may refer to one example of a row (e.g., the example row 212) from the activation count record 202. In particular, the activation count table 302 may include a plurality of entries with each entry corresponding to a respective way from an associated row of the activation count record. Thus, as shown in FIG. 3, the activation count table 302 may include a first row including an address and a count from a first row of the first way (Way 0), a second row including an address and count from the first row of the second way (Way 1) and so forth up to an Nth entry including an address and a count from the first row of the Nth way (Way N).

As shown in FIG. 3, the activation count table 302 may include a plurality of entries including a first column of addresses 304 and a second column of counts 306. In addition, the activation count table 302 may include a spillover entry 308 indicating a spillover count for the activation count table 302.

While FIG. 3 illustrates an example activation count table 302 including a table having sixteen entries and a spillover count, the activation count table 302 may include any number of entries to track estimates for activation counts associated with corresponding addresses. In the example shown, the number of entries in the activation count table 302 may correspond to a number of parallel ways from the SRAM structure on the memory controller 108. In other implementations, the activation count table 302 may include additional or fewer entries based on hardware specifications (e.g., dimensions of an SRAM structure) of the memory controller 108.

It will also be noted that the counts for the corresponding addresses represent estimates of counts for the associated addresses. For example, because the activation count table 302 may include a number of entries that is significantly fewer than a number of row addresses for a corresponding sub-bank, the activation count table 302 may rotate certain addresses out from the activation count table 302 as activation commands (e.g., activation command 201) are detected. Additional detail discussing how the activation count table 302 is updated is provided in further detail below in connection with FIG. 4.

Figure 4:
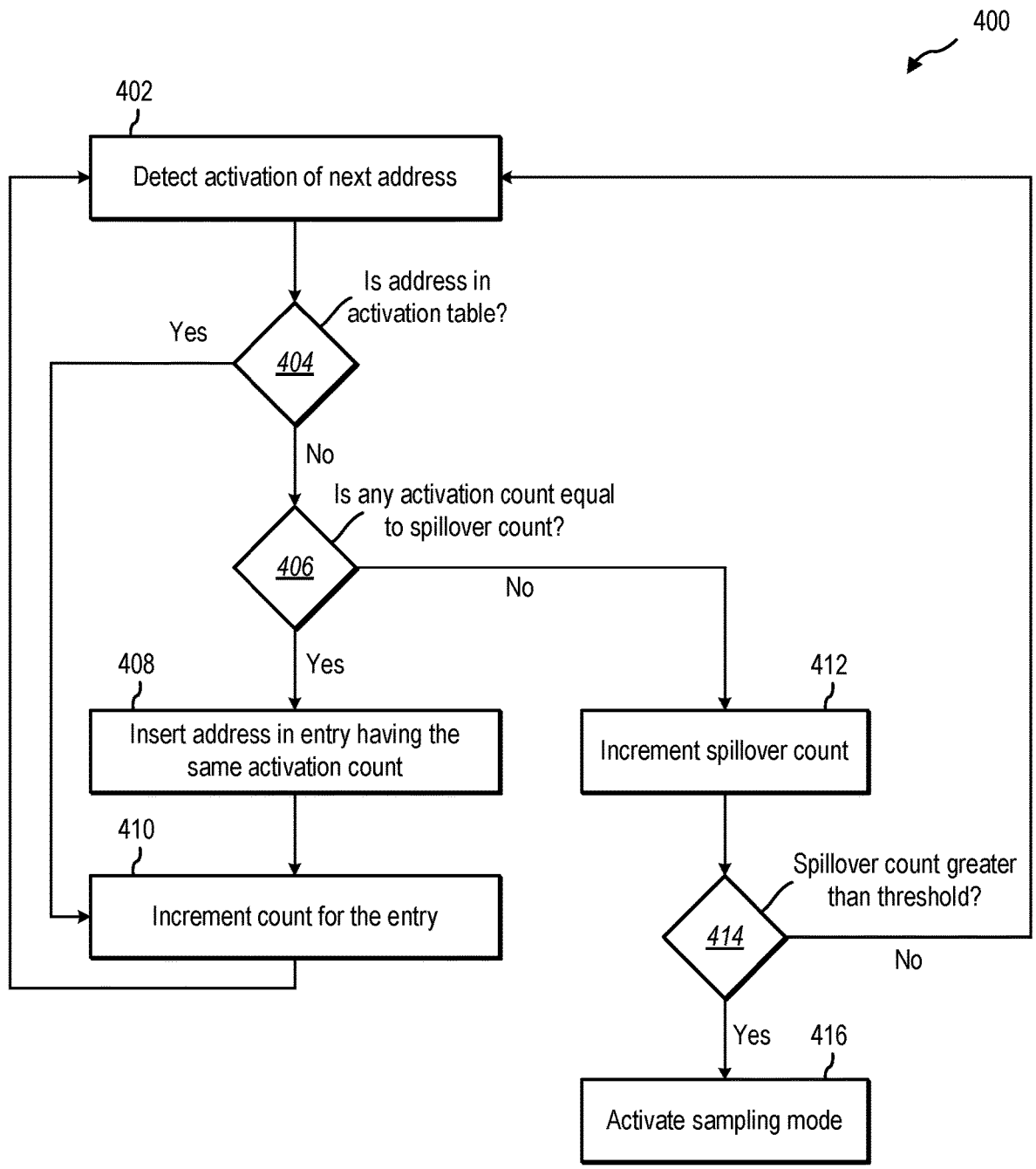
FIG. 4 illustrates an example series of acts when engaged in a counting mode for determining whether a possible aggressor row exists for a given memory sub-bank.

In particular, FIG. 4 illustrates an example series of acts 400 for updating respective entries of a corresponding activation count table. More specifically, FIG. 4 illustrates an example implementation in which the row hammer detection system 110 maintains activation counts for a corresponding memory sub-bank when engaged in a counting mode. In one or more embodiments, the row hammer detection system 110 engages the counting mode for each memory sub-bank as a default. The row hammer detection system 110 may implement the series of acts 400 for each row activation command receives while in the counting mode.

As shown in FIG. 4, the row hammer detection system 110 may perform an act 402 of detecting activation of a next address. For example, in one or more embodiments, the row hammer detection system 110 may receive, detect, or otherwise identify a row activation command indicating a sub-bank and associated address (e.g., row address). In one or more embodiments, the row hammer detection system 110 may identify a particular activation table (e.g., activation count table 302) to update (e.g., a particular row of the activation count record 202) based on the sub-bank identifier included within a row activation command.

Upon detecting activation of a next address, the row hammer detection system 110 may first perform an act 404 of determining whether an address in the memory sub-bank is available within the relevant activation table. For example, the row hammer detection system 110 may compare the address portion of the row activation command with a set of addresses in a first column of the activation count table and determine whether one of the addresses match the address from the row activation command. Where the address matches an existing address within the activation count table (e.g., a 'yes' at act 404), the row hammer detection system 110 may perform an act 410 of incrementing or otherwise iterating a count for the row entry (of the matching address). In other words, the row hammer detection system 110 may increment a count estimate for the matching address within the activation count table. As shown in FIG. 4, after incrementing the count for the row entry, the row hammer detection system 110 may return to perform act 402 with respect to a next row activation.

Alternatively, where the row hammer detection system 110 determines that the address does not match an existing address within the activation count table (e.g., a 'no' at act 404), the row hammer detection system 110 may perform additional steps in connection with updating the activation count table. For example, as shown in FIG. 4, the row hammer detection system 110 may perform an act 406 of determining whether any of the counts within the table entries of the activation count table are equal to the spillover count. More specifically, the row hammer detection system 110 may query the counts of the table and, if any of the counts for the corresponding addresses are equal to the spillover count, the row hammer detection system 110 may perform an act 408 of inserting an address of the detected row activation in an address field of the corresponding entry (or one of the address fields having counts that match the spillover count). The row hammer detection system 110 may then proceed to perform the act 410 of incrementing the count for the new row entry. As shown in FIG. 4, after incrementing the count for the row entry, the row hammer detection system 110 may return to perform act 402 with respect to a next row activation.

Returning to act 406, where the row hammer detection system 110 determines that there is not a table entry that is equal to the spillover count, the row hammer detection system 110 may perform an act 412 of incrementing or otherwise iterating the spillover count. As is evident from the illustrated series of acts 400, the spillover count should generally be the lowest count (or equal to the lowest count) of any of the entries within the activation table. Further, it is noted that one of the entries (e.g., either an address count or the spillover count) should increment with each row activation. Moreover, while entries within the activation count table may be replaced with any address of a corresponding sub-bank (e.g., as indicated at act 408), it will be appreciated that the specific counts for the corresponding addresses within the activation count table are reflective of upper-bound estimates for the addresses represented within the activation count table at any time. Thus, while the activation counts are not necessarily reflective of an exact number of activations for a particular row address, the activation counts do represent an upper-bound estimate for the corresponding row addresses.

As shown in FIG. 4, the row hammer detection system 110 may perform an act 414 of determining whether the spillover count for the activation count table is greater than (or equal to) a threshold count. Where the spillover count is not over the threshold count, the row hammer detection system 110 may return to perform act 402 with respect to a next row activation. Conversely, where the spillover count is greater than (or equal to) a threshold count, the row hammer detection system 110 may perform an act 416 of activating a sampling mode. Additional information in connection with implementing the sampling mode is discussed below.

It will be noted that the spillover count may be considered as a metric for determining whether the counting method is becoming overwhelmed by a potential row hammer attack. In one or more embodiments, the spillover count being at or above a threshold count may not mean that a row hammer attack is necessarily happening, but that a row hammer attack may be happening (or is predicted to be happening) based on non-normal read or write behavior that the counting mode is not fully-equipped to handle. This may be caused by a row hammer attack or, alternatively, may be caused by other read and/or write behavior with respect to row addresses of a particular sub-bank.

While not shown in FIG. 4, it will be understood that the series of acts 400 may be performed with respect to a certain interval of time. For example, in one or more embodiments, the activation count table may be cleared at periodic intervals (e.g., at each refresh window), which may include resetting the activation counts and the spillover count to zero. The row hammer detection system 110 may determine a specific interval of time based on specifications of the memory hardware 122 and/or hardware of the memory controller 108 (e.g., the SRAM structure).

While the clearing interval may vary from system to system, in one or more embodiments described herein, the row hammer detection system 110 resets the counts of the activation count table every refresh window depending on specifications or a generation of the DRAM hardware (e.g., 32 milliseconds in DDR5, 64 milliseconds in DDR4). In one or more implementations, the row hammer detection system 110 resets the activation counts for the associated memory sub-bank based on determining that the row hammer detection system 110 is engaged in the counting mode for the corresponding sub-bank after the predetermined interval has passed. Thus, in one or more examples described herein, after 32 milliseconds have passed without the spillover count hitting or exceeding the threshold and triggering activation of the sampling mode, the row hammer detection system 110 may assume that a row hammer attack is not currently happening for an associated memory sub-bank and reset the counts and continue tracking counts as discussed above in connection with FIG. 4. In one or more embodiments, the row hammer detection system 110 clears the counters of the activation count table using a counter invalid register (CIR) on the memory controller 108.

Moreover, it will be appreciated that the activation counters may not clear simultaneously for each of the sub-banks. For example, the refresh window may be staggered between the different sub-banks. Some sub-banks may have different length refresh windows than other sub-banks. In addition, as noted above, where the row hammer detection system 110 has activated a sampling mode for a given sub-bank, the row hammer detection system 110 may not reset the counts for the relevant sub-bank at the end of the predetermined interval. In one or more implementations, the row hammer detection system 110 may wait to receive specific instructions (e.g., from the memory hardware 122 or operating system 104) to transition back to the counting mode for the memory sub-bank. Additional detail in connection with determining whether (and when) to re-engage the counting mode will be discussed in further detail below.

Figure 5:
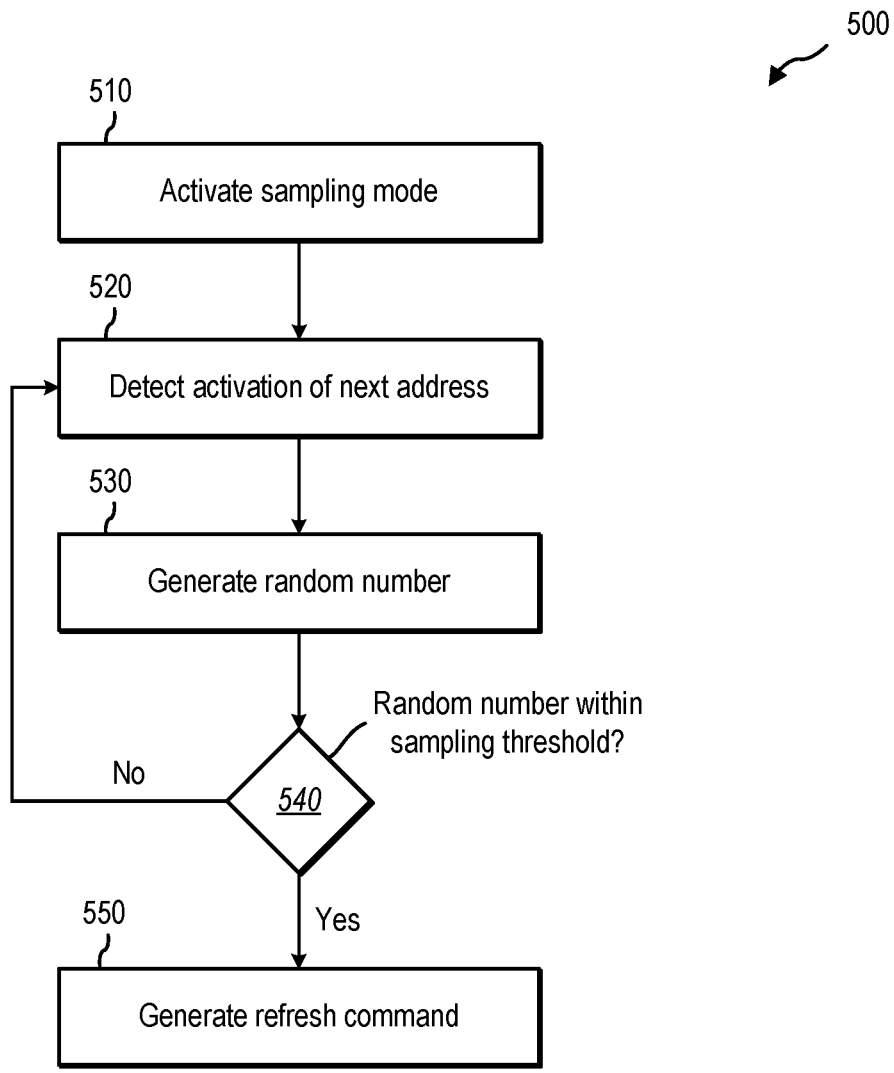
FIG. 5 illustrates an example series of acts when engaged in a sampling mode for mitigating a possible aggressor row of a given memory sub-bank.

FIG. 5 illustrates an example series of acts 500 that the row hammer detection system 110 may implement in response to detecting a trigger condition associated with transitioning from the counting mode to engage the sampling mode. For example, the row hammer detection system 110 may implement the series of acts 500 for a particular sub-bank based on detecting that a spillover count equals or exceeds a threshold value for a given interval of time (e.g., as shown in FIG. 4).

As shown in FIG. 5, the row hammer detection system 110 may perform an act 510 of activating or otherwise engaging a sampling mode. In one or more embodiments, activating the sampling mode involves determining one or more threshold and parameters associated with implementing the sampling mode. For example, the row hammer detection system 110 may define a sampling threshold that a random number may be compared against. In one or more embodiments, the sampling threshold is determined based on a maximum activation count (MAC) that the memory hardware 122 is configured to tolerate before bit values change as a result of a row hammer attack. For instance, as mentioned above, the MAC may refer to a metric that measures a number of activations a row can sustain until bits in an adjacent row (or within a certain blast radius) flip (e.g., from 0 to 1 or from 1 to 0).

As noted above, the sampling threshold may vary based on specifications of the memory hardware 122 and/or memory controller 108. As further mentioned above, the MAC value may be considered in determining the particular threshold value as well as the probability that a given random number will fall within the sampling threshold. In one or more embodiments, the threshold is set as MAC/4.4 based on an assumption that a row hammer attack may affect up to four rows. Other implementations may determine a slightly different threshold based on similar (or different) considerations unique to the memory hardware 122. As noted above, the MAC value may vary from device to device. Nonetheless, despite variable MAC values, sampling threshold values, and a sampling probability register value, it will be understood that one or more embodiments described herein may achieve a row hammer failure rate over a five-year lifetime of the memory hardware 122 that is less than 1e-10.

In addition to setting the sampling threshold, the row hammer detection system 110 may activate the sampling mode by setting an always sampling register (ASR) to an "on" value. While not expressly shown in FIGS. 4 and 5, in one or more embodiments, the row hammer detection system 110 may first view an ASR bit to determine whether to implement the acts in accordance with the counting mode (e.g., as shown in FIG. 4) or, alternatively, the acts in accordance with the sampling mode (e.g., as shown in FIG. 5). Accordingly, where the row hammer detection system 110 may be configured to check the ASR bit in response to each detected row activation, the ASR bit may act as a signal or trigger to implement one of the respective operational modes (i.e., counting mode or sampling mode). In this example, therefore, setting the ASR value to "on" would trigger the sampling mode for each subsequently detected activation row until the row hammer detection system 110 receives instructions to re-engage the counting mode.

While not shown in FIG. 5, as an alternative to setting an ASR bit to "on" to engage the sampling mode, the row hammer detection system 110 may additionally implement features for selectively determining when to re-engage the counting mode (or remain in the sampling mode). Additional detail in connection with conditions and triggers for transitioning from the sampling mode (or remaining in the sampling mode) will be discussed in further detail below.

As noted above, in one or more embodiments, the sampling mode is activated for a specific memory sub-bank. Indeed, in one or more examples described herein, the decision to transition between the counting mode and sampling mode will be performed on a sub-bank by sub-bank basis. Thus, where a sampling mode is activated for a first sub-bank, the row hammer detection system 110 may continue to maintain activation counts for other memory sub-banks of the same memory bank (and other memory banks) while implementing the sampling mode for the first memory sub-bank. In one or more embodiments, the row hammer detection system 110 may simultaneously perform a sampling mode on multiple sub-banks while implementing the counting mode on other (multiple) memory sub-banks.

Upon activating the sampling mode and setting the relevant parameters, sampling threshold, and other values, the row hammer detection system 110 may perform an act 520 of detecting an activation of a next address. For example, similar to one or more embodiments described above, the row hammer detection system 110 may identify an activation command including a corresponding address and sub-bank identifier. As discussed above, the row hammer detection system 110 may identify the relevant sub-bank based on the sub-bank identifier from the activation command.

As shown in FIG. 5, the row hammer detection system 110 may perform an act 530 of generating a random number. In one or more embodiments, the row hammer detection system 110 utilizes a linear feedback shift register (LFSR) (or other more robust mechanism) on the memory controller 108 to generate the random number. As noted above, the range of potential random numbers may be determined when the sampling mode is activated and the various thresholds and parameters for the sampling mode are determined.

As further shown, the row hammer detection system 110 may perform an act 540 of determining whether the random number is within a sampling threshold. As noted above, the sampling threshold may be determined upon activating the sampling mode. In at least one example described herein, the random number is compared to sampling probability register (SPR) value. The implementation of the source of randomness may dictate the specific value of the sampling threshold (e.g., how large the SPR value needs to be).

As noted above, the specific value(s) of the SPR and threshold may be determined based on hardware specifications of the memory controller 108 as well as an acceptable probability that a given row hammer attack may go unmitigated prior to causing data to be corrupted. In particular, the sampling threshold(s) may be determined to achieve a failure rate at or below a threshold value. In one or more embodiments described herein, the sampling thresholds may be determined based on a maximum activation count (MAC) metric that measures a number of activations a row can sustain until bits in an adjacent (or nearby) row starts to flip. This MAC value may represent a minimum recorded number of activations of a given row that causes bits in a nearby row (e.g., adjacent row) to flip. In one or more embodiments described herein, a MAC value may refer to approximately one-thousand (1,000). Nevertheless, other memory hardware 122 may have different MAC values, which would result in different sampling threshold values (e.g., as indicated in the table above).

As shown in FIG. 5, where the random number is not within the sampling threshold, the row hammer detection system 110 may return to act 520 and detect activation of a next row address. In this event, the row hammer detection system 110 may issue no refresh command for a given row address. Conversely, where the row hammer detection system 110 determines that the random number is within the sampling threshold, the row hammer detection system 110 may perform an act 550 of generating a refresh command.

The refresh command may include any command sent from the memory controller 108 to the memory hardware 122 to facilitate refreshing one or more rows of memory corresponding to the suspected row hammer attack. For example, in one or more embodiments, the refresh command includes a command indicating a particular row or range of rows and instructions that enable the memory hardware 122 to locally execute a refresh command on the particular row of memory. In one or more embodiments, the refresh command is a directed refresh management (DRFM) command having a hardware-specific scheme (e.g., a double data rate (DDR) scheme, such as DDR5) in which a memory controller reports the identity of an aggressor row and asks the memory hardware 122 (e.g., a DRAM device) to refresh all victims affected by a given aggressor row.

In one or more embodiments, the refresh command includes an indication of a blast radius. For example, the row hammer detection system 110 may generate and issue a refresh command indicating a row that is suspected as an aggressor row in combination with a blast radius of a predetermined number of rows (e.g., two rows) defining a threshold distance from the aggressor row. The blast radius may indicate both the aggressor row and row(s) on either side of the aggressor row within the threshold distance as row addresses that should be refreshed in response to the refresh command. In one or more embodiments, the row hammer detection system 110 simply identifies the aggressor row and an associated blast radius (or the blast radius is locally determined by the memory hardware 122). Alternatively, the row hammer detection system 110 may simply send a refresh command (e.g., a DRFM command) for each of the affected rows including the aggressor row and one or more rows (e.g., depending on the blast radius) on each side of the aggressor row.

As mentioned above, in one or more embodiments, the row hammer detection system 110 may limit a number of refresh commands issued for a given period of time. For example, in one or more embodiments, the row hammer detection system 110 may be limited to issuing a limited number of commands per memory bank for a given interval of time. In one or more embodiments described herein, the row hammer detection system 110 may be limited to a single refresh command every 7.8 microseconds (or other interval as determined by the hardware specifications).

To prevent the row hammer detection system 110 from violating this restriction of the memory system 106, the row hammer detection system 110 may track issued refresh commands over predetermined intervals (e.g., 7.8 microsecond intervals) to ensure that the row hammer detection system 110 does not issue more than the threshold number of commands over the predetermined interval (for a particular memory bank). In one or more embodiments, the row hammer detection system 110 may issue only one refresh command for a given memory bank or sub-bank within the predetermined interval. The predetermined number of commands as well as the predetermined interval may be known or otherwise determined based on specifications of the memory hardware 122.

In addition to determining whether to report a row address as an aggressor row by issuing a refresh command, the row hammer detection system 110 may further track or otherwise maintain a variety of data while engaged in the sampling mode. For example, as noted above, the row hammer detection system 110 may track a number of signals that may be used to determine whether to re-engage the counting mode after engaging the sampling mode for some period of time (e.g., multiple refresh windows).

Figure 6:
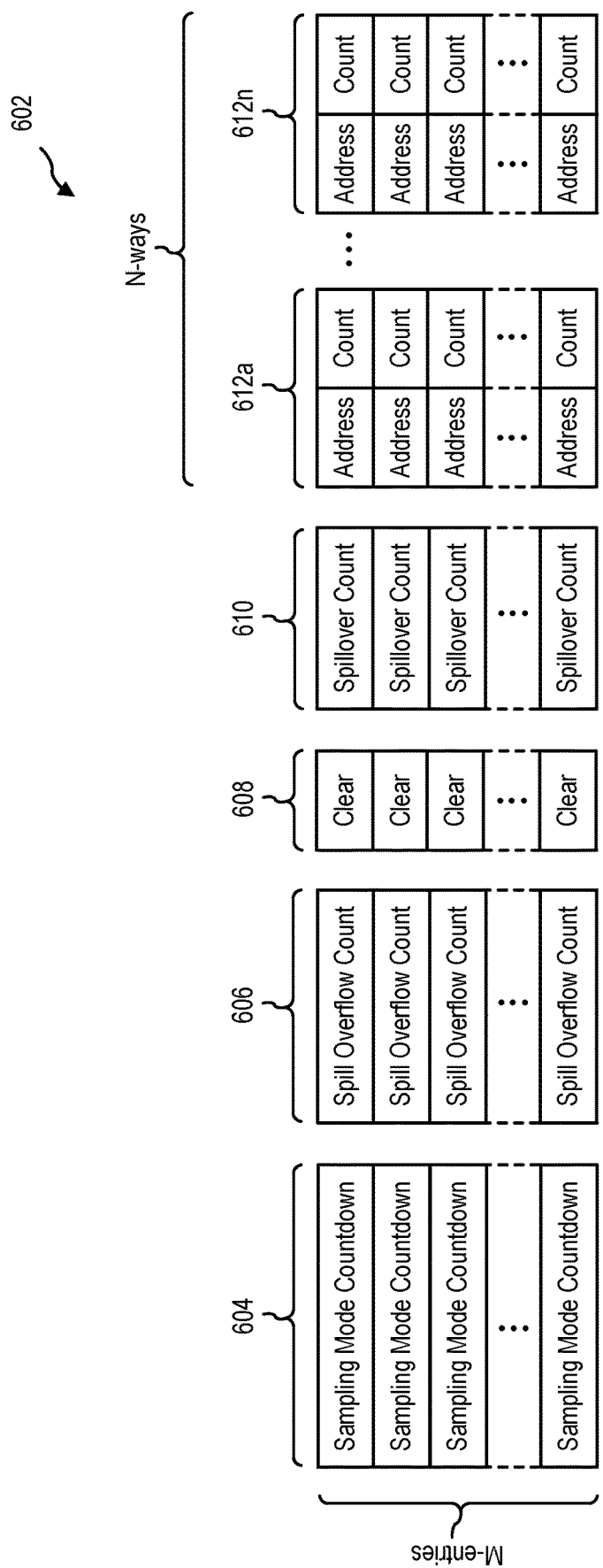
FIG. 6 illustrates an example countdown record including a sampling mode countdown in accordance with one or more embodiments.

By way of example, FIG. 6 illustrates an example counting record 602 that the row hammer detection system 110 may maintain while engaged in the sampling mode. As shown in FIG. 6, the counting record 602 may include one or more sampling mode countdowns 604, one or more spill overflow counts 606 (e.g., spill overflow countdowns), one or more clear bits 608, and additional values previously discussed in connection with implementing the counting mode. For example, as shown in FIG. 6, the counting record 602 may include spillover count(s) 610 as well as row address and count pairings 612*a-n* for one or more memory sub-banks banks. Similar to other records and entries described herein, the counting record 602 may be maintained within an SRAM structure on the memory controller 108.

As shown in FIG. 6, the counting record 602 may include any number of rows referred to as countdown entries. In this example, the counting record 602 may include M-entries (e.g., M-number of entries). Each of the countdown entries may include corresponding countdown and other tracked values associated with a corresponding memory sub-bank. In one example, the counting record 602 includes five-hundred twelve entries corresponding to an associated number of sub-banks for a plurality of memory banks. In one or more implementations, the counting record 602 only includes as many rows as there are sub-banks that have engaged a sampling mode. For instance, the row hammer detection system 110 may generate or populate a row of the counting record 602 based on engaging a sampling mode for an associated memory sub-bank. As shown in FIG. 6, each row of the counting record 602 may include some or all of the values of the respective entries.

As noted above, the counting record 602 includes a set of sampling mode countdowns 604. A sampling mode countdown may refer to a value from which the row hammer detection system 110 counts down in determining a length of time that an associated memory sub-bank remains engaged in the sampling mode. As noted above, the sampling mode represents a safer operational mode than the counting mode when there is a high likelihood or probable row hammer attack (e.g., resulting in the counting mode becoming overwhelmed). As such, it may be beneficial to remain in the sampling mode for some duration of time prior to re-engaging the counting mode under potentially vulnerable conditions.

Upon initiating the sampling mode countdown, the row hammer detection system 110 can cause the value of the countdown field to iterate at regular intervals. For example, in one or more embodiments, the set of sampling mode countdowns 604 decrements by a value at each refresh window. Where each memory sub-bank has an associated refresh window, each of the sampling mode countdown values may decrement while engaged in the sampling mode. In one or more embodiments, this act of decrementing is triggered by a value of the clear bits 608.

In one or more embodiments, the sampling mode countdown is initialized to a starting value and iterates (e.g., counts down) with each refresh window. For example, the row hammer detection system 110 may set the sampling mode countdown to a predetermined initial value associated with a desired or preconfigured length of time that the memory controller 108 should engage the sampling mode for the corresponding memory sub-bank. Indeed, the row hammer detection system 110 may determine (or receive instructions indicating) that the sampling mode should be engaged for a fixed duration of time upon transitioning from the counting mode to ensure that sufficient time has passed with an expectation or hope that the row hammer attack has been resolved.

An initial value of the sampling mode countdowns 604 may be based on a number of factors. For example, as noted above, a sampling mode countdown bit may be initially set based on a desired period of time that a memory controller 108 is configured to remain engaged in the sampling mode to prevent or mitigate a potential row hammer attack. In one or more embodiments, the sampling mode countdown value is initialized based on minimizing a number of refresh intervals that a memory sub-bank is considered vulnerable. Indeed, the row hammer detection system 110 may decrease a total number of vulnerable refresh windows by decreasing a total number of instances in which the memory controller 108 transitions between the counting mode and sampling mode.

In one or more embodiments, the initial value of the sampling mode countdown(s) is determined based on a maximum amount of time (e.g., one hour) over a longer duration of time (e.g., one month) that a given memory sub-bank should be vulnerable to row hammer attacks. In particular, the row hammer detection system 110 may establish an initial countdown value that ensures a maximum number of refresh windows that the memory sub-bank could be vulnerable as a result of transitioning between operational modes (e.g., under a worst case scenario, such as when the counting mode is promptly overwhelmed at each refresh window after re-engaging the counting mode).

In one or more embodiments, the initial countdown value is set at a high mark or high threshold value that causes or otherwise signals to the memory controller 108 to engage the sampling mode for an indefinite period of time. For example, where a row hammer attack is determined to be very likely or where a system-wide row hammer attack is confirmed, the row hammer detection system 110 may cause the memory controller 108 to engage the sampling mode for some or all of the memory sub-banks throughout the duration of the suspected or confirmed row hammer attack. In this example, the row hammer detection system 110 may fix the countdown value at the high threshold and cause the memory controller 108 to remain engaged in sampling mode until the row hammer attack is mitigated.

One or more of the sampling countdown values can be initialized to semi-random values. For example, in an effort to reduce the predictability of the countdown value and prevent potential deterministic approaches to implementing a row hammer attack, the row hammer detection system 110 may cause one or more of the bits represented in the sampling mode countdown to be randomized. As an illustrative example, the row hammer detection system 110 may randomize the three least significant bits (LSBs) of a sampling mode countdown value when initializing the sampling mode countdown value upon engaging the sampling mode. This randomness may prevent some deterministic approached to row hammer attacks without causing the memory controller 108 to remain in a sampling mode for an unreasonable number of refresh windows.

As further shown in FIG. 6, the counting record 602 may include a set of spill overflow counts 606. As described herein, the spillover overthrow count for a given entry may include a value indicative of a number of refresh windows during which the memory sub-bank is engaged in a sampling mode where the spillover count exceeded a threshold. As noted above, the row hammer detection system 110 may continue tracking various values related to the counting mode without issuing any refresh commands in response to the counting mode conditions.

For example, the row hammer detection system 110 may continue tracking address and count values 612*a-n* for corresponding memory sub-banks in addition to spillover counts 610 indicative of a condition where, had the memory sub-bank been engaged in a counting mode, the memory controller 108 would have engaged a sampling mode for the associated memory sub-bank. For example, the row hammer detection system 110 may track a number of activation counts similar to the examples described above in connection with FIGS. 2-4. In addition, the row hammer detection system 110 may iterate a value of a spill overflow count based on a detected instance in which the associated spillover count exceeds a threshold for a given refresh window. The row hammer detection system 110 may maintain the spill overflow counts 606 for each refresh window throughout a duration of time that the memory controller 108 has engaged the sampling mode for a corresponding memory sub-bank.

While some examples described herein refer to the spill overflow counts 606 as count-values indicating a number of refresh windows when corresponding spillover counts 610 exceed a threshold, in one or more embodiments, the spill overflow counts 606 are countdown values that count down from an initial value. For example, a spill overflow count may be initialized to a predetermined value upon engaging a sampling mode. As will be discussed in further detail below, the spill overflow count may decrement until hitting zero, which may serve as a signal when determining whether to re-engage a counting mode (e.g., after a corresponding sampling mode countdown has also decremented to zero).

In addition to general telemetry and tracking instances in which the counting mode would have been overwhelmed had the counting mode been engaged, tracking the spill overflow count also provides a benefit in that the row hammer detection system 110 may selectively determine whether to re-engage the counting mode based on a combination of the sampling mode countdown value and the corresponding spill overflow count value. For example, if the spill overflow count is greater than a threshold value, or is equal to any non-zero number, the row hammer detection system 110 may determine that the memory controller 108 will likely revert to the sampling mode within a short period of time. Based on this determination, the row hammer detection system 110 may determine to stay in the sampling mode even after the sampling mode countdown has reached a minimum value (e.g., zero).

In one or more embodiments, rather than establishing a static or predetermined threshold spill overflow count applicable to all memory sub-banks across the memory hardware, the row hammer detection system 110 may initialize a value of the spill overflow count for a given memory sub-bank to be a function of the initial value of the sampling mode countdown value. For example, the row hammer detection system 110 may set a spill overflow count to be a ratio of the initial sampling mode countdown value. Where the sampling countdown value has a measure of randomness, this may additionally introduce a measure of randomness in the spill overflow count, further increasing the difficulty in planning a row hammer attack on the memory hardware.

In this example where the spill overflow count is initialized to a non-zero value (e.g., a ratio of the initial sampling mode countdown value), the row hammer detection system 110 may make a determination of whether to iterate (e.g., decrement) the value of the spill overflow count at each refresh interval. For instance, similar to one or more examples described herein, the row hammer detection system 110 may iterate the spill overflow count at the beginning or end of a refresh interval based on the spillover count exceeding a threshold (or simply upon detecting that the spillover count exceeds the threshold).

The row hammer detection system 110 may consider the value of the spill overflow count in combination with the sampling mode countdown value in determining whether to re-engage the counting mode or continue to engage the sampling mode. For example, when the sampling mode countdown reaches zero (or other minimum threshold), the row hammer detection system 110 may re-engage the counting mode only where the spill overflow count is greater than zero. Otherwise, the row hammer detection system 110 may remain engaged in the sampling mode. Similar to other examples here, this further limits the number of times that the row hammer detection system 110 will transition between the operational modes, particularly when it would be highly likely that the memory controller 108 would likely re-engage the sampling mode after only a few refresh intervals.

As mentioned above, and as shown in FIG. 6, the counting record 602 includes a set of clear bits 608 for the respective entries (e.g., rows) of the counting record 602. The clear bits 608 may be toggled or set to signal that the sampling mode countdown should decrement at each refresh interval. In one or more examples above where a likely or confirmed row hammer attack is ongoing, each of the clear bits 608 may be set to an off or on mode associated with stopping the sampling mode countdown from decrementing for some period of time (and causing the memory controller 108 to remain engaged in a sampling mode indefinitely).

Figure 7:
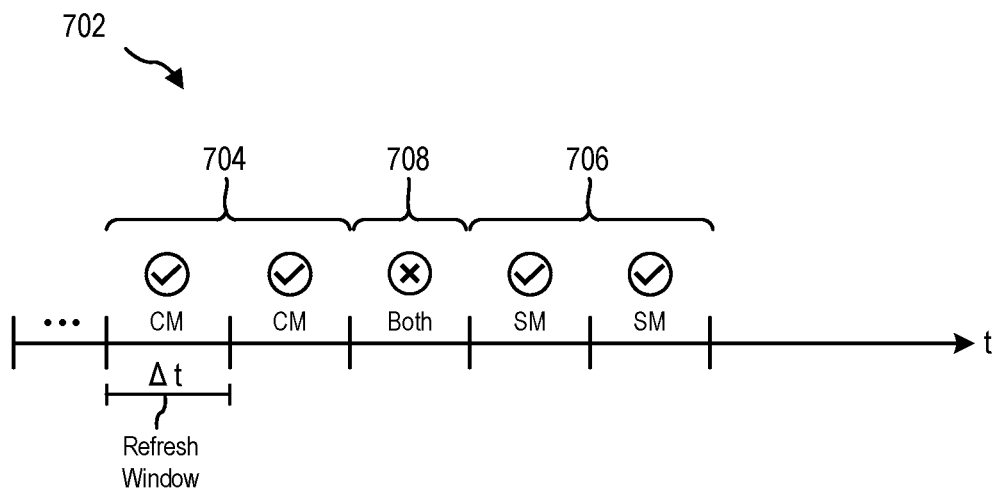
FIG. 7 illustrates an example timeline showing a series of refresh windows in which a row hammer detection system transitions between operational modes.
Figure 7:
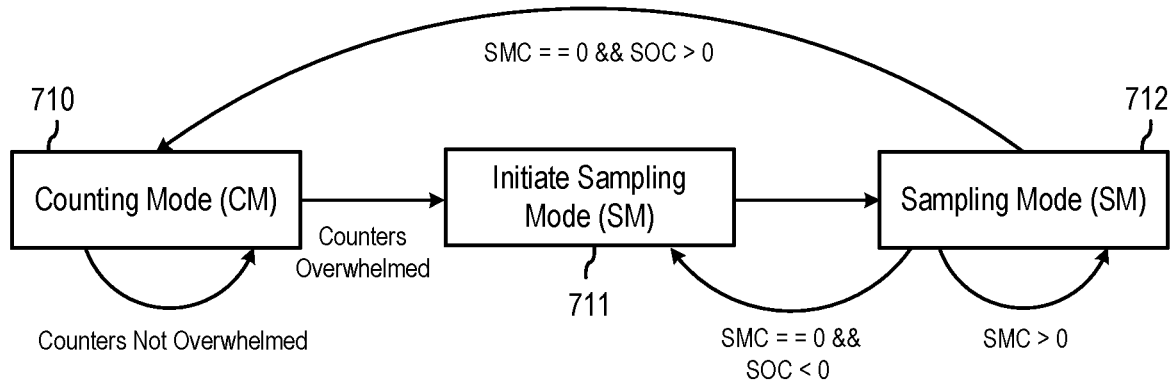

FIG. 7 illustrates an example timeline 702 showing engagement of operational modes by a memory controller 108 over a series of refresh windows. As shown in FIG. 7, the memory controller 108 may engage a counting mode (CM) 710 over a first counting mode stage 704 and transition to engage a sampling mode (SM) 712 over a second sampling mode stage 706. As shown in FIG. 7, the counting mode stage 704 may extend multiple refresh windows. Similarly, the sampling mode stage 706 may extend multiple refresh windows.

As further shown in FIG. 7, the memory sub-banks may be secure (or not otherwise vulnerable) from row hammer attacks during the indicated refresh windows. In this example, where the counting mode becomes overwhelmed and causes the memory controller 108 to transition from the counting mode to the sampling mode, the memory sub-bank associated with the timeline 702 may experience a transition window 708 in which the memory sub-bank is vulnerable to row hammer attacks. This is because the counting mode has become overwhelmed and between making this determination and transitioning to the more secure sampling mode, the memory sub-bank may be vulnerable. As noted above, the row hammer detection system 110 may limit the number of transition windows between operational modes by setting an initial value of a countdown to a particular value or establish certain conditions that limit going back and forth between operational modes (e.g., requiring a spill overflow count to be greater than zero or other predetermined value).

FIG. 7 additionally shows a sample workflow of events between engaging the counting mode (CM) 710, initiating a sampling mode (SM) 711 and engaging the sampling mode (SM) 712. For example, the memory controller 108 may remain engaged in the counting mode so long as the spillover count is less than a threshold. When the counters become overwhelmed, the row hammer detection system 110 may initialize a sampling mode (SM) 711 by initiating values of one or more countdowns. This may involve initiating values of the sampling mode countdown and spill overflow counts, as discussed in one or more embodiments above. The row hammer detection system 110 may then engage the sampling mode (SM) 712. The memory controller may remain in the sampling mode so long as the sampling mode countdown is above a minimum value (e.g., zero). The memory controller may additionally consider a spill overflow count in determining whether to remain in the sampling mode.

To illustrate, in the example shown in FIG. 7, where the sampling mode countdown is greater than zero, the row hammer detection system 110 may continue engaging the sampling mode (SM) 712. Where the sampling mode countdown hits zero and where the spill overflow count is equal to or less than zero, the row hammer detection system 110 may again initiate the sampling mode by setting values of the sampling mode countdown and spill overflow count to initial values and then re-engage the sampling mode. Alternatively, where the sampling mode countdown hits zero and where the spill overflow count is greater than zero (or other predetermined minimum value), the row hammer detection system 110 may re-engage the counting mode (CM) 710.

Figure 8:
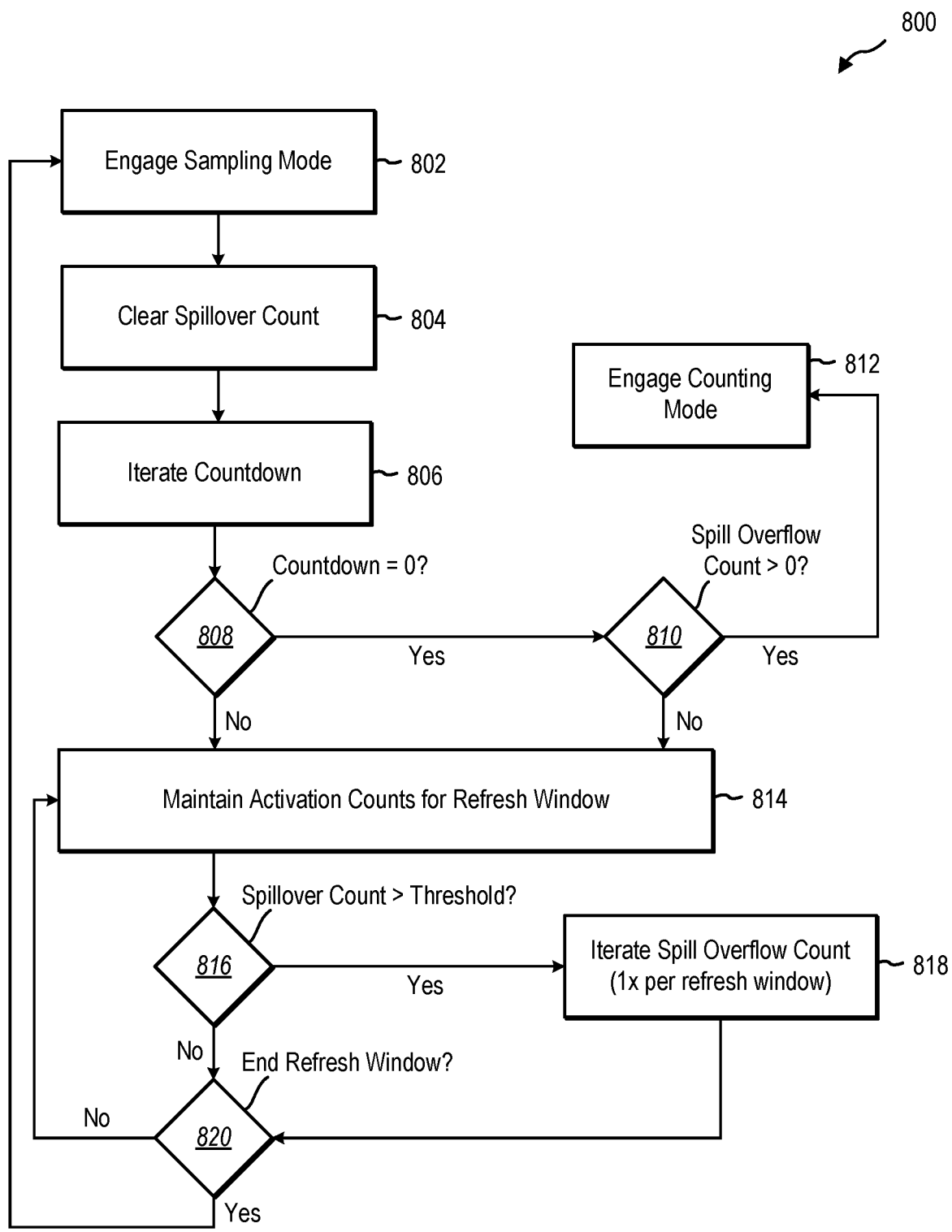
FIG. 8 illustrates a series of acts related to determining whether to transition between operational modes in detecting and mitigating row hammer attacks.

FIG. 8 illustrates an example series of acts 800 related to transitioning back and forth between the counting mode and the sampling mode under a variety of circumstances and based on a variety of policies. The acts shown in FIG. 8 may be implemented in connection with any of the above examples described herein. Moreover, any of the features and functionalities of the row hammer detection system 110 described in connection with previous examples may be combined with the series of acts 800 described below. In one or more embodiments, the series of acts 800 is performed by a memory controller 108 coupled to a memory hardware 122. Further, consistent with one or more embodiments described herein, the acts of FIG. 8 may be applicable to facilitating transition between operational modes for one or across multiple memory sub-banks.

As shown in FIG. 8, the series of acts 800 includes an act 802 of engaging a sampling mode. As noted above, engaging the sampling mode may involve transitioning from a counting mode based on the counting mode becoming overwhelmed for a given refresh window (e.g., based on a spillover count value exceeding a predetermined threshold). Also discussed above, engaging the sampling mode may involve a transition window in which the memory sub-bank is in a vulnerable state for the duration of a refresh window (e.g., thirty-two milliseconds). In one or more embodiments, the act 802 of engaging the sampling mode involves initiating the sampling mode for a memory sub-bank previously engaged in a counting mode. Other implementations may simply involve continuing engagement of a sampling mode for a subsequent refresh window (e.g., as discussed below in connection with act 820).

Upon engaging the sampling mode, row hammer detection system 110 may perform an act 804 of clearing a spillover count. As noted above, the row hammer detection system 110 may cause a spillover count for one or more memory sub-banks to clear at each refresh window. In this example, the row hammer detection system 110 may clear the spillover count based on initiating the sampling mode or, alternatively, based on detecting the beginning of a new refresh window (or an end of a previous refresh window).

In addition to clearing the spillover count, the row hammer detection system 110 may perform an act 806 of iterating a countdown. While not shown in FIG. 8, the row hammer detection system 110 may set the countdown to an initial value based on an estimated, minimum, or otherwise predetermined period of time that the memory controller 108 should be engaged in the sapling mode. Once initiated, the row hammer detection system 110 may iterate the countdown by decrementing (or incrementing) a value of the countdown with each refresh interval.

As shown in FIG. 8, the row hammer detection system 110 may perform an act 808 of determining whether the countdown has hit zero. Other implementations may involve determining that the countdown has fallen below an arbitrary threshold. If the countdown is less than (or equal to) the minimum threshold (e.g., zero), the row hammer detection system 110 may perform an act 810 of determining whether a spill overflow count has hit zero (e.g., when the spill overflow count is a countdown). In one or more embodiments, the row hammer detection system 110 may determine that the spill overflow count is less than a minimum threshold count associated with allowing the memory controller 108 to re-engage a counting mode.

It will be noted that while the sampling mode countdown and the spill overflow count are referred to herein interchangeably as counts or countdowns that are compared against threshold values, it will be appreciated that one or more embodiments of the memory controller may include hardware limitations that require the specific values to be countdown values. In this example, as shown in FIG. 8, the sampling mode countdown would be monitored to determine when a countdown value of both the sampling mode countdown and the spill overflow count(down) would equal zero.

As shown in FIG. 8, where the spill overflow count is greater than zero (e.g., where the spill overflow count has iterated or decremented less than some predetermined number of times), the row hammer detection system 110 may perform an act 812 of engaging (or re-engaging) the counting mode. Thus, in the illustrated example, based on the countdown hitting zero and the spill overflow count being greater than zero (e.g., failing to decrement to zero), the row hammer detection system 110 may transition from the sampling mode to the countdown mode until the countdown mode again becomes overwhelmed or the row hammer detection system 110 receives an indication of a likely row hammer attack.

As shown in FIG. 8, where the row hammer detection system 110 determines that the countdown has not reached zero and/or where the spill overflow count is not greater than zero (e.g., where the spill overflow count is equal to or less than a minimum value), the row hammer detection system 110 may perform an act 814 of maintaining activation counts for the refresh window and remaining engaged in the sampling mode. As noted above, even where the row hammer detection system 110 is not presented engaged in a counting mode, the row hammer detection system 110 may nevertheless maintain activation counts and spillover values for the memory sub-banks.

With each activation, the row hammer detection system 110 may perform an act 816 of determining whether a spillover count is greater than a threshold. For example, consistent with one or more embodiments described above, the row hammer detection system 110 may determine whether the spillover count for a refresh interval is greater than a threshold spillover count that triggers transitioning from a counting mode to a sampling mode.

Where the row hammer detection system 110 determines that the spillover count is greater than (or equal to) the threshold spillover count, the row hammer detection system 110 may perform an act 818 of iterating a spill overflow count (e.g., decrementing the spill overflow count by one). As shown in FIG. 8, this may occur once per refresh window. In the event that the spillover count is not greater than the threshold, or in the event that the spill overflow count has already been iterated for the current refresh window, the row hammer detection system 110 may perform an act 820 of determining if the refresh window has ended. Where the refresh window is still ongoing, the row hammer detection system 110 may continue performing the act 814 described above. Alternatively, where the refresh window has ended, the row hammer detection system 110 may again perform the act 802 by continuing to engage the sampling mode for the corresponding memory sub-bank.

In one or more embodiments, the row hammer detection system 110 may further implement integrity protection for the memory hardware by checking for a variety of errors and performing an appropriate action based on the type of error detected. For example, where an error is detected, but cannot be corrected, the row hammer detection system 110 may perform one of a variety of actions based on various policies.

For instance, where an error detected is a count (e.g., a row activation count), the row hammer detection system 110 may set the count to one less than the row hammer attack threshold (e.g., the threshold associated with a likelihood of a row hammer attack). As another example, where an error is detected in the spill overflow count while engaged in a counting mode, the row hammer detection system 110 may be set to zero. Where an error is detected in an address while engaged in the sampling mode, the row hammer detection system 110 may set the spillover count to the row hammer attack threshold.

Other errors may result in the row hammer detection system 110 determining whether to engage a specific operational mode. For example, in the case of other errors (e.g., other than the ones just mentioned above) that are detected while in counting mode, the row hammer detection system 110 may engage the sampling mode. In the case of other errors that are detected while in sampling mode, the row hammer detection system 110 may re-enter sampling mode.

The row hammer detection system 110 may implement integrity protection on a per-memory sub-bank basis with some frequency. For example, in one or more embodiments, the row hammer detection system 110 may perform an error check before the algorithms discussed above are run, on each row activation.

Figure 9:
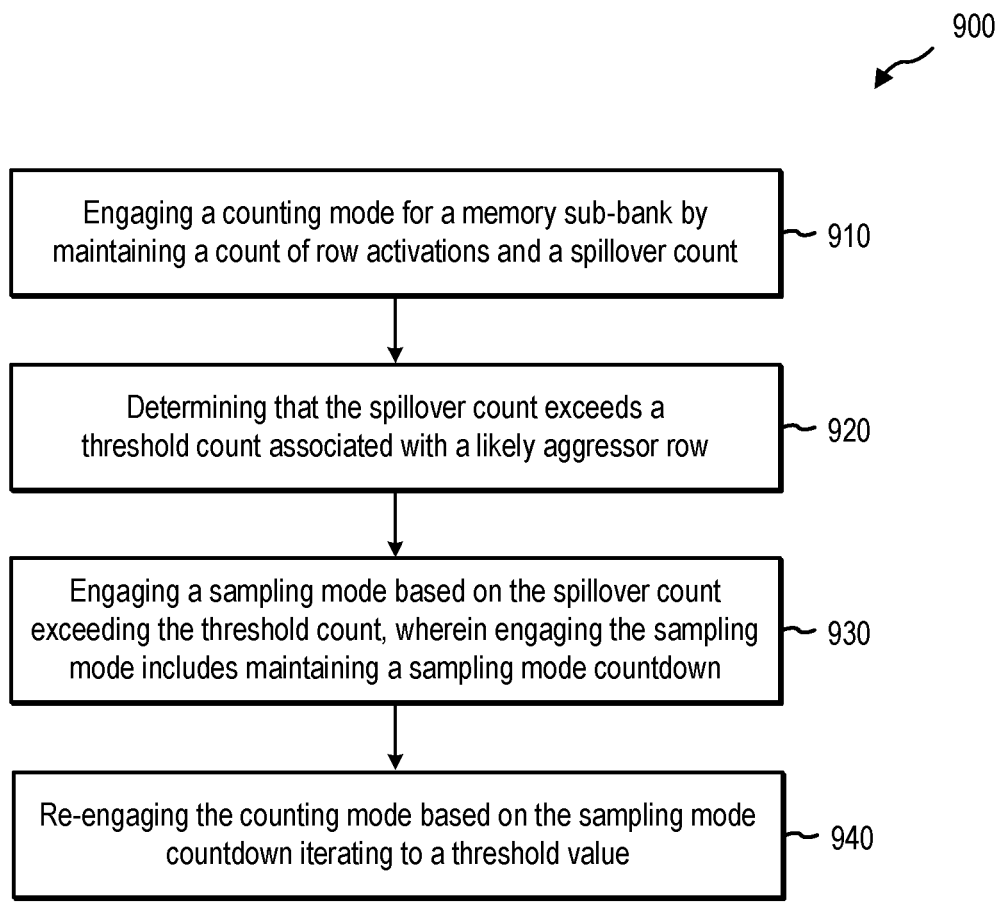
FIG. 9 illustrates another series of acts related to transitioning between operational modes in detecting and mitigating row hammer attacks.

Turning now to FIG. 9, this figure illustrates an example flowchart including a series of acts for detecting and mitigating a suspected row hammer attack on a row address of a memory hardware (e.g., DRAM device) as well as transitioning between operational modes in tracking activation of memory rows on the memory hardware. While FIG. 9 illustrates acts according to one or more embodiments, alternative embodiments may omit, add to, reorder, and/or modify any of the acts shown in FIG. 9. The acts of FIG. 9 can be performed as part of a method. Alternatively, a non-transitory computer-readable medium can include instructions that, when executed by one or more processors, cause a computing device (e.g., a server device) to perform the acts of FIG. 9. In still further embodiments, a system can perform the acts of FIG. 9.

FIG. 9 illustrates an example series of acts 900 related to detecting and mitigating a row hammer attack on a DRAM device as well as determining whether to transition between various operational modes associated with determining whether a row hammer attack is occurring on row address. As shown in FIG. 9, the series of acts 900 includes an act 910 of engaging a counting mode for a memory sub-bank by maintaining a count of row activations and a spillover count. In one or more embodiments, the act 910 involves engaging a counting mode for a memory sub-bank by maintaining a plurality of counts of row activations for memory rows within the memory sub-bank and a spillover count based on memory row activations for at least one memory row not included within the plurality of counts.

As further shown in FIG. 9, the series of acts 900 includes an act 920 of determining that the spillover count exceeds a threshold count associated with a likely aggressor row. In one or more embodiments, the act 920 includes determining that the spillover count exceeds a threshold count associated with a likelihood of an aggressor row from the memory sub-bank.

As further shown in FIG. 9, the series of acts 900 includes an act 930 of engaging a sampling mode based on the spillover count exceeding the threshold count where engaging the sampling mode including maintaining a sampling mode countdown. In one or more embodiments, the act 930 includes engaging a sampling mode for the memory sub-bank based on the spillover count exceeding the threshold count. In one or more implementations, engaging the sampling mode includes determining whether to report a row address as an aggressor row based on a comparison of a random number and a sampling threshold. In one or more embodiments, engaging the sampling mode includes maintaining a countdown for the sampling mode by iterating a sampling mode countdown value at refresh windows. In one or more embodiments, the sampling mode countdown is initialized to a first value based on a threshold number of refresh windows over a period of time for which the memory sub-bank is unprotected from a possible aggressor row.

As further shown in FIG. 9, the series of acts 900 includes an act 940 of re-engaging the counting mode based on the sampling mode iterating to a threshold value (e.g., zero). In one or more embodiments, the act 940 includes re-engaging the counting mode from the sampling mode based on the sampling mode countdown value iterating to a threshold countdown value.

In one or more embodiments, engaging the sampling mode includes maintaining counts of row activations and associated spillover counts for the memory sub-bank over a plurality of refresh windows. Engaging the sampling mode may further include maintaining a spill overflow count indicating a number of refresh windows while the sampling mode is engaged in which the spillover count was determined to exceed the threshold count. In one or more embodiments, re-engaging the counting mode is further based on the spill overflow count being less than a spill overflow count threshold. In one or more embodiments, the spill overflow count is a countdown value and re-engaging the counting mode is further based on the countdown value reaching zero of the spill overflow count being equal to zero. In one or more embodiments, the counts of row activations and associated spillover counts for the memory sub-bank are cleared at each refresh window of the plurality of refresh windows.

In one or more embodiments, the series of acts 900 includes determining a vulnerable condition of the memory sub-bank associated with one or more aggressor rows on the DRAM device. The series of acts 900 may further include, based on determining the vulnerable condition of the memory sub-bank, fixing an operational mode for the memory sub-bank to the sampling mode by setting a value of the sampling mode countdown to a high threshold countdown value.

In one or more embodiments, engaging the sampling mode includes initializing the sampling mode countdown value to an initial value, the initial value being a randomized value within a predetermined range of initial sampling mode countdown values. In one or more embodiments, the memory sub-bank is one of a plurality of memory sub-banks from a memory bank of the DRAM device where engaging the sampling mode includes selectively engaging the sampling mode for the memory sub-bank without causing one or more additional memory sub-banks of the plurality of memory sub-banks to engage sampling modes.

In one or more embodiments, determining whether to report an aggressor row includes determining that the random number falls within the sampling threshold and issuing a refresh command for the row address indicating that the row address is a predicted aggressor row. In one or more embodiments, a table on which the plurality of counts of row activations and the spillover count is maintained in an SRAM structure on a memory controller coupled to the DRAM device.

In one or more embodiments, the series of acts 900 includes acts that are configured to be performed by a memory controller coupled to a DRAM device where the DRAM device includes a plurality of memory banks, each memory bank from the plurality of memory banks including a plurality of memory sub-banks.

In one or more embodiments, the memory controller may perform an act of engaging a sampling mode for a memory sub-bank where engaging the sampling mode includes determining whether to report a row address as an aggressor row based on a comparison of a random number and a sampling threshold and maintaining a countdown for the sampling mode by iterating a sampling mode countdown value at refresh windows. In one or more embodiments, the memory controller ay perform an act of engaging a counting mode for the memory sub-bank based on the sampling mode countdown value iterating to a threshold value, wherein engaging the counting mode for the memory sub-bank includes maintaining a plurality of counts of row activations for memory rows within the memory sub-bank and a spillover count based on memory row activations for at least one memory row not included within the plurality of counts. In one or more embodiments, the memory controller may perform an act of determining whether to re-engage the sampling mode for the memory sub-bank based on whether the spillover count exceeds a threshold count associated with a likelihood of an aggressor row of the memory sub-bank.

Similar to one or more embodiments described above, the memory controller may engage the sampling mode by maintaining counts of row activations and associated spillover counts for the memory sub-bank over a plurality of refresh windows and maintaining a spill overflow count indicating a number of refresh intervals while the sampling mode is engaged in which the spillover count was determined to exceed the threshold count. In one or more embodiments, engaging the counting mode is further based on the spill overflow count being less than or equal to a spill overflow count threshold. Further, in one or more embodiments, engaging the sampling mode includes initializing the sampling mode countdown value to an initial value, the initial value being a randomized value within a predetermined range of initial sampling mode countdown values.

Figure 10:
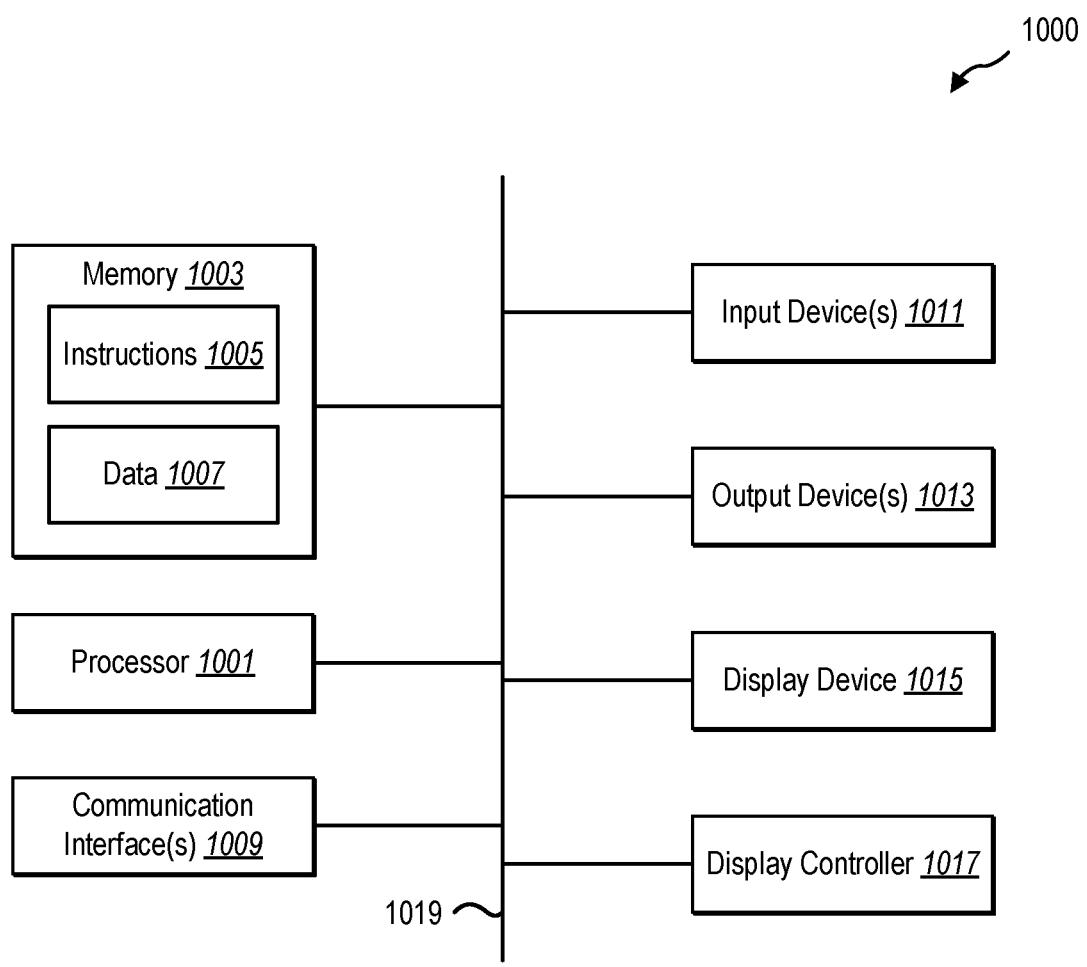
FIG. 10 illustrates certain components that may be included within a computer system.

FIG. 10 illustrates certain components that may be included within a computer system 1000. One or more computer systems 1000 may be used to implement the various devices, components, and systems described herein.

The computer system 1000 includes a processor 1001. The processor 1001 may be a general-purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 1001 may be referred to as a central processing unit (CPU). Although just a single processor 1001 is shown in the computer system 1000 of FIG. 10, in an alternative configuration, a combination of processors (e.g., an ARM and DSP) could be used.

The computer system 1000 also includes memory 1003 in electronic communication with the processor 1001. The memory 1003 may be any electronic component capable of storing electronic information. For example, the memory 1003 may be embodied as random access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM) memory, registers, and so forth, including combinations thereof.

Instructions 1005 and data 1007 may be stored in the memory 1003. The instructions 1005 may be executable by the processor 1001 to implement some or all of the functionality disclosed herein. Executing the instructions 1005 may involve the use of the data 1007 that is stored in the memory 1003. Any of the various examples of modules and components described herein may be implemented, partially or wholly, as instructions 1005 stored in memory 1003 and executed by the processor 1001. Any of the various examples of data described herein may be among the data 1007 that is stored in memory 1003 and used during execution of the instructions 1005 by the processor 1001.

A computer system 1000 may also include one or more communication interfaces 1009 for communicating with other electronic devices. The communication interface(s) 1009 may be based on wired communication technology, wireless communication technology, or both. Some examples of communication interfaces 1009 include a Universal Serial Bus (USB), an Ethernet adapter, a wireless adapter that operates in accordance with an Institute of Electrical and Electronics Engineers (IEEE) 802.11 wireless communication protocol, a Bluetooth© wireless communication adapter, and an infrared (IR) communication port.

A computer system 1000 may also include one or more input devices 1011 and one or more output devices 1013. Some examples of input devices 1011 include a keyboard, mouse, microphone, remote control device, button, joystick, trackball, touchpad, and lightpen. Some examples of output devices 1013 include a speaker and a printer. One specific type of output device that is typically included in a computer system 1000 is a display device 1015. Display devices 1015 used with embodiments disclosed herein may utilize any suitable image projection technology, such as liquid crystal display (LCD), light-emitting diode (LED), gas plasma, electroluminescence, or the like. A display controller 1017 may also be provided, for converting data 1007 stored in the memory 1003 into text, graphics, and/or moving images (as appropriate) shown on the display device 1015.

The various components of the computer system 1000 may be coupled together by one or more buses, which may include a power bus, a control signal bus, a status signal bus, a data bus, etc. For the sake of clarity, the various buses are illustrated in FIG. 10 as a bus system 1019.

The techniques described herein may be implemented in hardware, software, firmware, or any combination thereof, unless specifically described as being implemented in a specific manner. Any features described as modules, components, or the like may also be implemented together in an integrated logic device or separately as discrete but interoperable logic devices. If implemented in software, the techniques may be realized at least in part by a non-transitory processor-readable storage medium comprising instructions that, when executed by at least one processor, perform one or more of the methods described herein. The instructions may be organized into routines, programs, objects, components, data structures, etc., which may perform particular tasks and/or implement particular data types, and which may be combined or distributed as desired in various embodiments.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

As used herein, non-transitory computer-readable storage media (devices) may include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

The steps and/or actions of the methods described herein may be interchanged with one another without departing from the scope of the claims. In other words, unless a specific order of steps or actions is required for proper operation of the method that is being described, the order and/or use of specific steps and/or actions may be modified without departing from the scope of the claims.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method implemented by a memory controller coupled to a dynamic random access memory (DRAM) device, the method comprising:
   engaging a counting mode for a memory sub-bank by maintaining a plurality of counts of row activations for memory rows within the memory sub-bank and a spillover count based on memory row activations for at least one memory row not included within the plurality of counts;
   determining that the spillover count exceeds a threshold count associated with a likelihood of an aggressor row from the memory sub-bank;
   engaging a sampling mode for the memory sub-bank based on the spillover count exceeding the threshold count, wherein engaging the sampling mode includes:
      determining whether to report a row address as an aggressor row based on a comparison of a random number and a sampling threshold; and
      maintaining a countdown for the sampling mode by iterating a sampling mode countdown value over a plurality of refresh windows; and
   re-engaging the counting mode from the sampling mode based on the sampling mode countdown value iterating to a threshold countdown value.

2. The method of claim 1, wherein the sampling mode countdown value is initialized to a first value based on a threshold number of refresh windows over a period of time for which the memory sub-bank is unprotected from a possible aggressor row.

3. The method of claim 1, wherein engaging the sampling mode further includes:
   maintaining counts of row activations and associated spillover counts for the memory sub-bank over the plurality of refresh windows; and
   maintaining a spill overflow count indicating a number of refresh windows while the sampling mode is engaged in which the spillover count was determined to exceed the threshold count.

4. The method of claim 3, wherein re-engaging the counting mode is further based on the spill overflow count being less than a spill overflow count threshold.

5. The method of claim 3, wherein the spill overflow count is a countdown value, and wherein re-engaging the counting mode is further based on the countdown value of the spill overflow count being equal to zero.

6. The method of claim 3, wherein the counts of row activations and associated spillover counts for the memory sub-bank are cleared at each refresh window of the plurality of refresh windows.

7. The method of claim 1, further comprising:
determining a vulnerable condition of the memory sub-bank associated with one or more aggressor rows on the DRAM device; and
based on determining the vulnerable condition of the memory sub-bank, fixing an operational mode for the memory sub-bank to the sampling mode by setting an initial value of the sampling mode countdown value to a threshold countdown value, the threshold countdown value being associated with a period of time in which the vulnerable condition of the memory sub-bank is expected to be mitigated.

8. The method of claim 1, wherein engaging the sampling mode includes initializing the sampling mode countdown value to an initial value, the initial value being a randomized value within a predetermined range of initial sampling mode countdown values.

9. The method of claim 1, wherein the memory sub-bank is one of a plurality of memory sub-banks from a memory bank of the DRAM device, and wherein engaging the sampling mode includes selectively engaging the sampling mode for the memory sub-bank without causing one or more additional memory sub-banks of the plurality of memory sub-banks to engage sampling modes.

10. The method of claim 1, wherein determining whether to report an aggressor row includes:
determining that the random number falls within the sampling threshold; and
issuing a refresh command for the row address indicating that the row address is a predicted aggressor row.

11. The method of claim 1, wherein a table on which the plurality of counts of row activations and the spillover count is maintained in an SRAM structure on the memory controller coupled to the DRAM device.

12. A system, comprising:
a dynamic random access memory (DRAM) device including a plurality of memory banks, each memory bank from the plurality of memory banks including a plurality of memory sub-banks; and
a memory controller coupled to the DRAM device, the memory controller being configured to:
engage a counting mode for a memory sub-bank by maintaining a plurality of counts of row activations for memory rows within the memory sub-bank and a spillover count based on memory row activations for at least one memory row not included within the plurality of counts;
determine that the spillover count exceeds a threshold count associating with a likelihood of an aggressor row from the memory sub-bank;
engage a sampling mode for the memory sub-bank based on the spillover count exceeding the threshold count, wherein engaging the sampling mode includes:
determining whether to report a row address as an aggressor row based on a comparison of a random number and a sampling threshold; and
maintaining a countdown for the sampling mode by iterating a sampling mode countdown value over a plurality of refresh windows; and
re-engage the counting mode from the sampling mode based on the sampling mode countdown value iterating to a threshold countdown value.

13. The system of claim 12,
wherein re-engaging the counting mode from the sampling mode causes the memory sub-bank to be vulnerable to a possible aggressor row for a refresh window, and
wherein the sampling mode countdown value is initialized to an initial value based on a threshold number of refresh windows over a period of time for which the memory sub-bank is unprotected from a possible aggressor row.

14. The system of claim 12, wherein engaging the sampling mode further includes:
maintaining counts of row activations and associated spillover counts for the memory sub-bank over the plurality of refresh windows; and
maintaining a spill overflow count indicating a number of refresh windows over which the sampling mode is engaged when the spillover count was determined to exceed the threshold count.

15. The system of claim 14, wherein the memory controller is configured to re-engage the sampling mode from the counting mode based in part on the spill overflow count being less than a spill overflow count threshold.

16. The system of claim 12, wherein engaging the sampling mode includes initializing the sampling mode countdown value to an initial value, the initial value being a randomized value within a predetermined range of initial sampling mode countdown values.

17. A method implemented by a memory controller coupled to a dynamic random access memory (DRAM) device, the method comprising:
engaging a counting mode for a memory sub-bank by maintaining a plurality of counts of row activations for memory rows within the memory sub-bank;
determining that the counting mode for the memory sub-bank has become overwhelmed; and
engaging a sampling mode for the memory sub-bank based on the counting mode for the memory sub-bank becoming overwhelmed, wherein engaging the sampling mode includes:
determining whether to report a row address as an aggressor row based on a comparison of a random number and a sampling threshold; and
maintaining a countdown for the sampling mode by iterating a sampling mode countdown value at refresh windows; and
re-engaging the counting mode from the sampling mode based on the sampling mode countdown value iterating to a threshold countdown value.

18. The method of claim 17, wherein determining that the counting mode for the memory sub-bank has become overwhelmed is based on determining that a spillover count tracked while engaged in the counting mode has exceeded a threshold count.

19. The method of claim 17,
wherein engaging the sampling mode causes the memory sub-bank to be vulnerable to a possible aggressor row for a refresh window, and wherein the sampling mode countdown value is initialized to an initial value based on a threshold number of refresh windows over a period of time for which the memory sub-bank is unprotected from a possible aggressor row.

20. The method of claim 17, wherein engaging the sampling mode includes initializing the sampling mode countdown value to an initial value, the initial value being a randomized value within a predetermined range of initial sampling mode countdown values.

21. The method of claim 17, wherein a table on which the plurality of counts of row activations is maintained in an SRAM structure on the memory controller coupled to the DRAM device.

* * * * *